(12) United States Patent
Fratello

(10) Patent No.: US 10,378,123 B2
(45) Date of Patent: Aug. 13, 2019

(54) SINGLE-CRYSTAL PEROVSKITE SOLID SOLUTIONS WITH INDIFFERENT POINTS FOR EPITAXIAL GROWTH OF SINGLE CRYSTALS

(71) Applicant: QUEST INTEGRATED, LLC, Kent, WA (US)

(72) Inventor: Vincent Fratello, Bellevue, WA (US)

(73) Assignee: QUEST INTEGRATED, LLC, Kent, WA (US)

( * ) Notice: Subject to any disclaimer, the term of this patent is extended or adjusted under 35 U.S.C. 154(b) by 0 days.

(21) Appl. No.: 16/065,688

(22) PCT Filed: Oct. 31, 2017

(86) PCT No.: PCT/US2017/059341
§ 371 (c)(1),
(2) Date: Jun. 22, 2018

(87) PCT Pub. No.: WO2018/081809
PCT Pub. Date: May 3, 2018

(65) Prior Publication Data
US 2019/0003077 A1    Jan. 3, 2019

Related U.S. Application Data

(60) Provisional application No. 62/415,341, filed on Oct. 31, 2016.

(51) Int. Cl.
*C30B 11/00* (2006.01)
*C30B 29/32* (2006.01)
(Continued)

(52) U.S. Cl.
CPC ............. *C30B 29/32* (2013.01); *C30B 11/00* (2013.01); *C30B 11/14* (2013.01); *C30B 15/00* (2013.01);
(Continued)

(58) Field of Classification Search
CPC .......... C30B 11/00; C30B 11/14; C30B 29/22
See application file for complete search history.

(56) References Cited

U.S. PATENT DOCUMENTS 5,637,542 A    6/1997  Takenaka
6,231,779 B1 *  5/2001  Chiang ................. B82Y 15/00
                                           252/62.9 R
(Continued)

OTHER PUBLICATIONS

Aksay, et al., "Stable and Metastable Equilibria in the System SiO2—Al2O3", Journal of the American Ceramic Society; vol. 58, Issues 11-12, Nov. 1975, pp. 507-512.
(Continued)

*Primary Examiner* — Robert M Kunemund
(74) *Attorney, Agent, or Firm* — Christensen O'Connor Johnson Kindness PLLC

(57) ABSTRACT

Growth of single crystal epitaxial films of the perovskite crystal structure by liquid- or vapor-phase means can be accomplished by providing single-crystal perovskite substrate materials of improved lattice parameter match in the lattice parameter range of interest. Current substrates do not provide as good a lattice match, have inferior properties, or are of limited size and availability because cost of materials and difficulty of growth. This problem is solved by the single-crystal perovskite solid solutions described herein grown from mixtures with an indifferent melting point that occurs at a congruently melting composition at a temperature minimum in the melting curve in the pseudo-binary molar phase diagram. Accordingly, single-crystal perovskite solid solutions, structures, and devices including single-crystal perovskite solid solutions, and methods of making single-crystal perovskite solid solutions are described herein.

20 Claims, 16 Drawing Sheets

(51) Int. Cl.
*C30B 15/00* (2006.01)
*C30B 19/00* (2006.01)
*C30B 23/00* (2006.01)
*C30B 25/00* (2006.01)
*C30B 29/22* (2006.01)
*C30B 29/30* (2006.01)
*C30B 11/14* (2006.01)
*C30B 15/36* (2006.01)
*C30B 19/12* (2006.01)
*C30B 25/06* (2006.01)

(52) U.S. Cl.
CPC .............. *C30B 15/36* (2013.01); *C30B 19/00* (2013.01); *C30B 19/12* (2013.01); *C30B 23/00* (2013.01); *C30B 25/00* (2013.01); *C30B 25/06* (2013.01); *C30B 29/22* (2013.01); *C30B 29/30* (2013.01)

(56) References Cited

U.S. PATENT DOCUMENTS

| | | |
|---|---|---|
| 7,205,256 B2 | 4/2007 | Kijima et al. |
| 2002/0179000 A1 | 12/2002 | Lee et al. |
| 2004/0139911 A1* | 7/2004 | Chiang ................ C01G 23/006 117/47 |
| 2009/0212667 A1* | 8/2009 | Matsushita ............. C30B 29/32 310/360 |
| 2015/0233015 A1* | 8/2015 | Fratello ................... H01L 41/41 73/865.8 |
| 2015/0313576 A1* | 11/2015 | Yamamoto ........... A61B 8/5207 600/447 |

OTHER PUBLICATIONS

International Search Report and Written Opinion dated Jan. 26, 2018 in corresponding International Application No. PCT/US2017/059341, filed Oct. 31, 2017, 8 pages.

* cited by examiner

SINGLE-CRYSTAL PEROVSKITE SOLID SOLUTIONS WITH INDIFFERENT POINTS FOR EPITAXIAL GROWTH OF SINGLE CRYSTALS

BACKGROUND

Perovskites

Perovskites are a class of compounds that have a similar crystal structure to the mineral perovskite (calcium titanate—$CaTiO_3$). Perovskites are network compounds—that is to say they are defined by a network of anions (negative ions, most commonly oxygen $O^{2-}$) with specific holes for cations (positive ions, most commonly metallic ions). The most common nominal perovskite formula is $ABO_3$, though other anions are possible and off-stoichiometry compounds with vacancies occur. The A site is a large twelve-coordinated cubo-octahedral hole typically occupied by a cation with an ionic radius greater than or equal to that of $O^{2-}$, as this site is equivalent in size and coordination to an oxygen vacancy. The B site is a smaller six-coordinated octahedral hole. Ordered and disordered compounds with two (or more) cations on the A site (($A_y A'_{(1-y)}$)$BO_3$) or, more commonly, the B site ($A(B_x B'_{(1-x)})O_3$), where x and y are atomic/molar proportions with values between 0 and 1 atoms per formula unit, are possible with formula units represented by integer multiples of the simple perovskite with unit cells that can be formed by combinations of the primitive single formula unit perovskite cell.

A majority of the metals in the periodic table can be inserted into the cation sites and still have a perovskite structure as long as constraints of valence and ionic size are met. For a charge-balanced compound, the total positive charge of the cations and the negative charge of the anions must be equal. Therefore, the integer 1-1-3 $ABO_3$ stoichiometry constrains the average cation valences on the total A and B sites of a stoichiometric oxide perovskite to be 3+ or, viewed by site, the average of the sum of the A and B valences to be 6+, i.e. $A^{v+}B^{(6-v)+}O_3$, where v is an integer valence between 1 and 5. This can be accomplished with various combinations, e. g. $A^{1+}B^{5+}O_3$, $A^{2+}B^{4+}O_3$, $A^{3+}B^{3+}O_3$.

As discussed above, complex ordered and disordered perovskite compounds with multiple A and/or B ions can occur as long as the average 3+ valence is maintained by the sum of the individual ion valences multiplied by the stoichiometry. If there is a cation vacancy fraction, that fraction is assigned a valence of zero in the average. If there is an oxygen vacancy fraction f $ABO_{3-f}$ then the average of the cation valences must equal the actual average number of oxygens per formula unit 3-f. If an ion of a different valence, such as a halogen, e. g. $F^-$, substitutes on the oxygen site, then the required average valence of the cations is changed by a proportional amount. Examples of oxide perovskite cation substitutions with defined fractions include, but are not limited to:

$B^{4+}$ replaced by $B^{3+}_{1/2}B'^{5+}_{1/2}$ (3×½+5×½=4)
$B^{4+}$ replaced by $B^{2+}_{1/3}B'^{5+}_{2/3}$ (2×⅓+5×⅔=4)
$B^{4+}$ replaced by $B^{1+}_{1/4}B'^{5+}_{3/4}$ (1×¼+5×¾=4)
$B^{3+}$ replaced by $B^{2+}_{1/2}B'^{4+}_{1/2}$ (2×½+4×½=3)
$A^{2+}$ replaced by $A^{1+}_{1/2}A'^{3+}_{1/2}$ (1×½+3×½=2)

As is well understood by those knowledgeable in the art, real compounds can deviate slightly from these perfect stoichiometries by the presence of impurities, vacancies, interstitials, anti-site ions (e. g. A on the B-site or B on the A-site), reduced or oxidized ions and other defects without changing the fundamental nature of the compound. These deviations may commonly comprise 1% or more of the atoms or 0.05 or more of the five atomic sites in a primitive $ABO_3$ formula unit. Further, defect compounds may have even more extensive deviations up to 10% of the atoms or 0.5 of the five atomic sites in a primitive $ABO_3$ formula unit. Therefore, all compositions cited may be approximate, as used herein, the terms "approximate" and "approximately" indicate that the subject number can be modified by plus or minus 10% and still fall within the disclosed embodiment.

When two ions of the same valence occur on the same site, they tend to form a disordered or partially ordered continuous solid solution where the x variable can be any value from 0 to 1. An example is the well-known piezoelectric material lead zirconate titanate (PZT) with an approximate chemical formula $Pb^{2+}(Zr^{4+}_x Ti^{4+}_{(1-x)})O_3$ where x varies continuously from zero to unity.

Ordered and disordered $A_2BB'O_6$ (often written as $A(B_{1/2}B'_{1/2})O_3$) compounds tend toward cubic/tetragonal/orthorhombic/monoclinic unit cells, while ordered $A_3BB'_2O_9$ (often written as $A(B_{1/3}B'_{2/3})O_3$) compounds tend toward hexagonal/rhombohedral unit cells. A higher order unit cell may be constrained by symmetry to be one that is rotated with respect to a simple cubic perovskite unit cell of one $ABO_3$ formula unit (sometimes called primitive or reduced). For example, the a and b axes of a complex unit cell are often rotated by an angle of 45° from the (1,0,0) and (0,1,0) primitive axes to the (1,1,0) and (1,-1,0) primitive axes so that the lattice parameters are increased by $\sqrt{2}$. Less commonly, an axis may be rotated toward the (1,1,1) direction of the simple primitive single formula unit cell so that the lattice parameters are increased by $\sqrt{3}$ or to the (2,1,1) direction so the lattice parameters are increased by $\sqrt{6}$. The perovskite structure is subject to polarization and distortion so the a, b and c lattice parameters may differ in tetragonal and orthorhombic crystal structures. In some of these unit cells, the lattice parameter angles may also deviate significantly from 90° in rhombohedral, hexagonal, monoclinic and triclinic structures.

The phase stability and crystallographic structure of perovskites depend on the relation between the average ionic sizes on the two sites in the crystal. The ease of formation of a perovskite for any A-B pair depends on the crystal ionic radii or, in the case of more complex structures, averaged site crystal ionic radii, and is given by the dimensionless Goldschmidt perovskite tolerance factor T:

$$T = \frac{r_A + r_O}{\sqrt{2}\,(r_B + r_O)} \qquad (1)$$

where $r_A$ and $r_B$ are the average A- and B-site ionic radii and $r_O$ is the oxygen ionic radius commonly accepted to be 0.126 nm. It has been observed that stability of the perovskite structure may be expected within the limits T=0.88 to 1.09, but is best near unity T=1.00. The "crystal radii" as tabulated by Shannon (R. D. Shannon, "Revised Effective Ionic Radii and Systematic Studies of Interatomic Distances in Halides and Chalcogenides," Acta. Cryst. A32 (1976) 751) are used herein for $r_A$ and $r_B$ since they best represent the situation in the perovskite rather than the free ionic radii.

Roth has made detailed diagrams for the simple $A^{2+}$-$B^{4+}$ and the $A^{3+}$-$B^{3+}$ perovskites showing how the likely phase varies with ranges of $r_A$ and $r_B$. See R. S. Roth, "Classification of Perovskite and Other $ABO_3$-Type Compounds," J. Res. N. B. S. 58 (1957) 75. Cubic perovskites occur for T closer to unity and are preferred as substrates because the properties are isotropic (especially the crystallographic and dielectric properties) and there are no anisotropic distortions, phase changes or twinning problems.

The hard sphere model can be used to estimate the cubic or pseudo-cubic hard sphere lattice parameter $a_{hs}$ of the perovskites as $$a_{hs} = \frac{r_A + r_O}{\sqrt{2}} + (r_B + r_O) \qquad (2)$$

The values so calculated are typically higher than measured cubic/pseudo-cubic lattice parameters a by a factor that depends on the tolerance factor T and the A-site ionic radius $r_A$. Numeric fitting gives an improved approximation for valences v=2, 3 by multiplication of $a_{hs}$ by this factor:

$$a/a_{hs} = 1.102 - 0.247T + 0.074 r_A \qquad (3)$$

Additional data and higher levels of approximation can improve this fit. Data for v=1 appear offset somewhat from this fit to a smaller factor $a/a_{hs}$ and even lower lattice parameters.

Crystal Growth

Perovskites comprise a number of technologically important materials because of their range of interesting properties and ability to polarize. These materials can be ferroelectric, electrooptic, ferromagnetic, ferrimagnetic, antiferromagnetic, multiferroic, piezoelectric, pyroelectric, magnetoresistive, colossal magnetoresistive (CMR), magnetooptic, photovoltaic, photoluminescent, insulating, conducting, semiconducting, superconducting, ferroelastic, catalytic, etc.

Therefore, it is important to have a variety of growth methods available to prepare single crystals, which are generally the most desired technological form. The methods that can be used to grow a crystal depend on whether the crystal composition is congruent or incongruent. Congruent compounds are those where the compound of interest crystallizes directly from a liquid of the same composition at a local maximum or minimum on the melting curve and similarly the crystal melts directly to the liquid of the same composition at a constant temperature. A congruent composition may be a stoichiometric line compound that can only have a single composition or a preferred stoichiometry of a multi-component phase that is off the nominal stoichiometric composition. The property of congruency allows the growth of large single crystals of uniform composition by bulk growth methods. Incongruent crystallization occurs when, upon cooling, a solid phase nucleates with a different composition from the liquid. Incongruent melting occurs when, upon heating, one solid phase thermodynamically transforms to an equilibrium state of another solid phase and a liquid phase each of different chemical composition from the original. Therefore, incongruent compounds are more challenging to grow and require different crystal growth methods to prepare in single crystals or films of the desired composition.

Epitaxial Growth

Epitaxy is when a crystal film of one material is grown on top of and in registry with another material, typically called a substrate. In many cases, good quality uniform incongruently melting perovskite crystals can only be grown by epitaxial means. In other cases, epitaxy is required to grow very thin films or multilayers, where the substrate provides both a template and a means of support and the thin film two-dimensional nature of the material provides important confinement or other constraints and properties for devices.

Epitaxial growth is useful for growth of materials that, for various reasons, are not amenable to growth by conventional bulk techniques wherein the crystal is grown directly from the melted target compound. The list below covers a number of cases that are relevant.

Non-congruent melting materials (including peritectic melting) may have to be grown from a melt with a composition that strongly differs from the desired crystal composition. Complex mixtures including most solid solutions have phase diagrams where the crystallizing compound can be very far off the melt composition.

High melting point oxides are often outside the limits of bulk techniques because of limits on the use temperature of the crucible and/or other furnace materials or because of a high vapor pressure of a constituent.

Compounds with volatile constituents such as lead oxide may have to be equilibrated and grown at substantially lower temperatures than their melting point to be stable. This in turn limits the solubility of the crystal constituents in a solution.

Epitaxial growth gives the ability to vary growth conditions including temperature, chemical environment and atmosphere so that unstable crystal materials can be stabilized.

Epitaxial growth methods include, for example, liquid phase epitaxy (LPE) from 1) a high temperature solution (HTS), 2) a hydrothermal environment, 3) a partially melted flux or 4) a sol-gel. Vapor phase means include, for example, sputtering, thermal evaporation, physical vapor deposition (PVD), chemical vapor deposition (CVD), metal-organic chemical vapor deposition (MOCVD), vapor phase epitaxy (VPE), organo-metallic vapor phase epitaxy (OMVPE), molecular beam epitaxy (MBE), chemical beam epitaxy (CBE), atomic layer epitaxy (ALE), and pulsed laser deposition (PLD).

Epitaxy on a planar substrate inherently has a two-dimensional film growing in a single growth direction, though the actual growth steps may propagate laterally and there can be edge growth. Compared to point-seeded methods that require growth in three dimensions, epitaxy has a high volumetric growth rate because the crystal only needs to expand in one dimension with a planar growth front from a seed that starts with a large two-dimensional area. It is the only practical method to grow thin two-dimensional single crystal films.

Substrates

To grow quality epitaxial crystals and, in many cases, to grow the desired phase at all, the film and substrate must have an acceptable match in structure, chemistry, lattice parameter and coefficient of thermal expansion, although there are some notable exceptions. The substrate must be of good crystal quality since any defects will normally propagate into the film. It should be polished to an epitaxial (sometimes optical) quality surface with no subsurface damage and good flatness. The substrate must be chemically compatible with the film and with the epitaxial growth environment. The substrate should not contain any constituents that would fatally contaminate the film if there is interdiffusion or breakage in the melt, nor should it have any properties harmful to operation of a device containing the film, since it will, of necessity, remain part of the film/substrate composite unless it can be removed after growth (typically thick films). It should have no destructive phase transition between room temperature and the epitaxial growth temperature and preferably no phase transition at all. For a commercial technology, the substrate material should be able to be grown ≥50 mm in diameter or square dimensions. Lastly, for an economical technology, the constituents of the substrate should be of the lowest possible cost.

Substrate crystals growable by some large-scale bulk process can be matched up with non-congruent film compositions that must be grown by epitaxial techniques to produce film/substrate combinations with effective composite properties. However, there are limited choices of perovskite crystals that can be grown as uniform crystals in bulk form.

The prior art teaches that bulk crystal growth processes typically have the constraints described below.

A substrate material is most readily grown by a bulk process if it is congruently melting, i. e. having a single composition at which the liquid and solid are at equilibrium at a local maximum or minimum on the melting curve. This is necessary to produce a crystal of uniform composition. This is most typically a characteristic of a line compound of fixed or optimum stoichiometry.

Most bulk growth technologies, including the Czochralski and Bridgman methods, require that the crystal be grown from a crucible. This is typically a precious metal such as iridium or platinum, as they are inert and have high melting temperatures. The melting temperature of the substrate crystal to be grown should be within the operating range of the crucible material, typically <1600° C. for growth from platinum in a resistance or radiofrequency (RF) heated furnace and <2200° C. for growth from an iridium crucible in an RF furnace.

All substrate constituents should have as low a vapor pressure as possible under bulk growth conditions. The ionic constituents should not be easily reduced under the bulk growth conditions. If an iridium crucible is used, the material to be grown must be stable in a low oxygen atmosphere, typically ≤3% $O_2$ and even lower for higher growth temperatures. The melted substrate material should not be reactive with or significantly dissolve the crucible material.

No destructive phase transitions should occur between the bulk growth temperature and room temperature, and preferably there should be no phase transitions at all. Perovskites are very prone to lattice distortions at room temperature, but these often do not persist to the melting temperature, where the crystal may grow in a cubic form. The easiest means to assure that the substrate crystal retains its integrity and that the grown film is uniformly in registry with the substrate is if the substrate crystal maintains the cubic structure down to room temperature.

FIG. 1 depicts a plot of known substrate materials (bottom) and some desired film materials (top) plotted on the average lattice parameter number line for the simple perovskite single formula unit $ABO_3$ unit cell. Note that some of these materials, especially the epitaxial category, have actual unit cells that are more complex with multiple lattice parameters including integer multiples of the simple unit cell and or even higher order multiples of the lattice parameter(s) when the unit cell is rotated, but for the purposes of comparison in this plot, the lattice parameters are all converted to the simple primitive/reduced single formula unit perovskite unit cell or, in some cases, to a pseudo-cubic lattice parameter in a given plane. As can be seen from the plot, there are substrate candidates with primitive lattice parameters from 0.367 to 0.417 nm, however from 0.387 to 0.412 nm there is a dearth of cubic materials that may be readily grown. Problems with existing compounds on the number line in this range are discussed below.

The rare earth scandates $DyScO_3$ through $PrScO_3$ can be grown as single crystals by the Czochralski method. These materials are slightly distorted from the cubic to an orthorhombic structure, but do not have a destructive phase change and can be cut perpendicular to the c-axis to have a pseudo-cubic plane structure for substrates. However, there is anisotropic distortion in this plane in both lattice parameter and coefficient of thermal expansion. Additionally, scandium oxide is a highly refractory material and these compounds have extremely high melting temperatures close to the 2200° C. limit. Scandium is also a rare earth group metal with limited availability and high cost and the other rare earth constituents are also expensive in varying degrees and can have limited availability. These substrate materials are available for research studies from only one small quantity research lab supplier, the Leibniz Institute for Crystal Growth, and their fabrication partners. The substrates provided are small in size and high in cost. The crystal growth yield is low because the material is challenging to grow and there is a high chance of crucible failure at such melting temperatures close to the operating limit of the crucible and furnace.

Potassium tantalate $KTaO_3$ is not congruently melting, but rather peritectic (see FIG. 2) and has been grown from an off-stoichiometry melt for scientific samples. FIG. 2 illustrates a pseudo-binary phase diagram of the system $K_2CO_3$—$K_2O$—$Ta_2O_5$. It is referred to as pseudo-binary because there are more degrees of freedom not being considered, most specifically the oxygen stoichiometry of the perovskite phase is set at the nominal stoichiometric value of 3. The region from 75 to 100 mol % represents equilibrium between $Ta_2O_5$ and $K_2CO_3$. $K_2CO_3$ decomposes at higher temperatures and $Ta_2O_5$ concentrations, so the region from 0 to 75 mol % represents equilibrium between $Ta_2O_5$ and the decomposition product $K_2O$. The perovskite compound of interest with approximate molar chemical formula $KTaO_3$ melts peritectically. (A. Reisman, F. Holtzberg, M. Berkenblit, and M. Berry, ACerS-NIST Ceramic Phase Equilibria Diagrams, Version 4.0, American Ceramic Society and National Institute of Standards and Technology, (2014), Phase Diagram 00173 originally from J. Am. Chem. Soc., 78 (1956) 4514). $KTaO_3$ may be grown by the self-flux method from an excess of $K_2O/K_2CO_3$.

The principal U.S. supplier, Commercial Crystal Laboratories, has gone out of business and a few samples may be had collaboratively from Oak Ridge National Laboratory. There is at least one commercial supplier in China. The sizes available range from 5-20 mm, which is too small for any commercial product and the available commercial substrates are very expensive.

Strontium titanate $SrTiO_3$ has a high melting point and is readily reduced unless the growth atmosphere is highly oxidizing or the growth temperature is lowered by use of a solution. Crystals are commercially prepared by flame-fusion growth and have also been grown experimentally from KF—LiF and K—Li-borate fluxes. Neither of these techniques is amenable to growth of large crystals and this material also has high costs.

Lanthanum gallate $LaGaO_3$ and neodymium gallate $NdGaO_3$ are not cubic and are subject to twinning.

So, for any commercial technology there is a virtual valley in the lattice parameter number line with no viable commercial congruently melting cubic perovskite substrate candidates. Therefore, innovation is required to permit growth of epitaxial crystals with a good lattice match in this lattice parameter range.

Perovskite Solid Solutions

A solid solution is a homogeneous mixture of two substances that can exist as a solid (in this case a crystalline solid) over a range of proportions between the two end members such that the crystal structure of either end member remains unchanged or only slightly distorted by the addition of the other. Even though all these materials are solids, this can be conventionally thought of as one substance (the solute) being added to another (the solvent). But, if the two end members have the same crystal structure, the two end members can fill the atomic sites of this structure by substitution, and all possible proportions between the two end members are homogeneous crystals of that structure, then this is described as a continuous solid solution. In this way, neither end member is exclusively the solvent or the solute. Solid solutions are typically thought of as disordered, whereas a perfectly ordered stoichiometric mixture is a compound with a fixed composition or range of compositions. However, varying degrees of order and disorder including clustering may be present over the range of compositions in a solid solution.

Because of the common structure, solid solutions readily form between two perovskites, where two end members, e.g., $ABO_3$ and $A'B'O_3$ may mix with fractions $0<x<1$ to a range of ordered, partially ordered and disordered materials $A_xA'_{1-x}B_xB'_{1-x}O_3$ (in the terminology used above, this is equivalent to x=y). If A=A', this is somewhat simplified to $AB_xB'_{1-x}O_3$ as is the case for some of the materials discussed in this application. Similarly, if B=B', this is simplified to $A_xA'_{1-x}BO_3$. However, because solid solutions are not line compounds with a fixed composition, these commonly have complex melting and crystallization behaviors as is well known to those familiar with the art. For even a simple binary solid solution phase diagram, the compound that crystallizes at any composition will, in most cases, tend to be biased toward the higher melting compound. The farther apart the two melting points, the more the liquidus (temperature where the last solid phase melts on heating or the first solid phase appears on cooling) deviates from the solidus (temperature where the last liquid phase solidifies on cooling or the first liquid phase appears on heating) and therefore more segregation occurs.

FIG. 3 illustrates this for the technologically important continuous solid solution between the perovskites potassium tantalate $KTaO_3$ and potassium niobate $KNbO_3$, which have lattice parameters near the region of interest ~0.40 nm.

These two perovskites are exemplary of an ordinary continuous solid solution. (D. Rytz and H. J. Scheel, "Crystal growth of $KTa_{1-x}Nb_xO_3$ ($0<x\leq0.04$) solid solutions by a slow-cooling method," Journal of Crystal Growth 59 (1982) 468). In such an ordinary solid solution, the compound that crystallizes at any composition is biased toward the higher melting compound. The farther apart the two end phase melting points, the more the liquidus (heavy line) deviates from the solidus (fine line) and, therefore, more segregation occurs. As a crystal is grown from a melt of composition $x_L$, the crystal will grow at crystallization temperature $T_C$ with a higher proportion of tantalum, $x_S$, than in the melt, per the dashed horizontal tie line in FIG. 3. This depletes the melt of the end member $KTaO_3$ and therefore the crystal growth path will proceed down the liquidus/solidus curves toward $KNbO_3$ with a steadily reducing growth temperature and a steadily decreasing proportion of tantalum in the melt and in the crystal, though the solid forming at any given time will always contain more tantalum than the melt at that same time. Therefore, any crystal grown in this way will have a varying composition, properties and, if the ions are of different sizes, lattice parameter through the length and be of limited technological use.

The substrate material SAGT, $Sr_{1.04}Al_{0.12}Ga_{0.35}Ta_{0.50}O_3$ listed in FIG. 1 is a solid solution of SAT ($Sr^{2+}Al^{3+}_{1/2}Ta^{5+}_{1/2}O_3$) and SGT ($Sr^{2+}Ga^{3+}_{1/2}Ta^{5+}_{1/2}O_3$) with two 3+ ions, $Al^{3+}$ and $Ga^{3+}$, on the B site. Experimentally it is observed that there is some anti-site Sr on the B site. This compound is not congruently melting and therefore has a varying lattice parameter as discussed above.

Indifferent Points

A small number of continuous solid solutions have a unique feature where the liquidus and solidus curves come together at a congruently melting maximum or minimum at some fixed proportion. This is referred to an azeotrope in vapor-liquid systems, which include the well-known ethanol-water system. For liquid-solid systems, it is properly referred to as an indifferent point and this point constitutes congruent melting. There are a substantial number of alkali halides that display this behavior, but relatively few perovskites recorded to date.

The requirements for an indifferent point to occur must be discussed in terms of the phase rule of thermodynamics. This is often oversimplified in the literature and therefore its application in this case is explained briefly here. The phase rule defines the degrees of freedom of a materials system at equilibrium F as a relation between the rank of the coefficient matrix N (equal to the number of independent components in the system) and the number of phases Π. Typically, N is taken to be equal to the number of components, but that oversimplification loses information critical to understanding indifferent points.

In this case, pressure is constant and the only variables are composition and temperature, thus the so-called "condensed" phase rule F=N−Π+1 applies. In a pseudo-binary phase diagram, it is the common teaching of the phase rule that N=2 and under these circumstances, two phases (Π=2) can come together on an equilibrium line (F=1), but an equilibrium point (F°=0) requires the meeting of three phases (Π=3). (It is referred to as pseudo-binary because there are more degrees of freedom not being considered, most specifically the oxygen stoichiometry is set at the nominal stoichiometric value of 3.) If there is a continuous solid solution, a congruently melting indifferent point (F=0) appears to violate the phase rule as there are only two phases (Π=2) a liquid and a solid of the same composition.

The problem arises in the assumption that N=2. The number of independent components is the rank of the coefficient matrix. The rank of the coefficient matrix equals the number of components if the determinant is non-zero. If the state in question strictly minimizes the total internal energy in the sense of Gibbs's minimum energy principle, then the rank of the coefficient matrix equals the number of components and Gibbs's traditional phase rule is valid (N=2 here). However, the coefficient matrix for a binary mixture can have a zero determinant at some composition, in which case the rank is 1 (same as the equations not being independent). If this is the case, the matrix form of the Gibbs-Duhem equation does not require that all differential chemical potentials be zero (dμ=0) and that the total internal energy be minimized. This is the condition that permits an indifferent point in a solution.

Another way this has been described is to view the solid solution at the indifferent point as consisting of two solid solutions with the same composition, one a solution of D in C (γ) and another of C in D (δ). If there is an ordering transition, possibly based on a combination of packing, stress and electrostatic energies, that could result in these two solid solutions being explicitly distinct.

However, the mathematical condition of a zero determinant does not usefully predict which chemical systems will have such an indifferent point. An indifferent point can occur when either the solid or liquid deviates from an ideal solution through a non-zero enthalpy of mixing (also called heat of mixing). Most commonly this occurs in the solid, so that will be discussed here, but the opposite sign of the deviation of the enthalpy of mixing in the liquid can have the same effect. The enthalpy of mixing $\Delta H_m$ in a simple C-D mixture can be viewed in terms of the enthalpies of adjacent bonds between two C atoms, $H_{CC}$, two D atoms, $H_{DD}$ and a C and a D atom, $H_{CD}$.

$$\Delta H_m \propto x(1-x)[H_{CD}-(H_{CC}+H_{DD})/2] \quad (4)$$

If the enthalpy of the C-D bond is lower than the average of the C—C and D-D bonds, then the enthalpy of mixing is negative (more thermodynamically favorable) and it reinforces the free energy contribution of the entropy of mixing $\Delta S_m$:

$$-t\Delta S_m = Rt(x \ln(x)+(1-x)\ln(1-x)) \quad (5)$$

where R is the universal gas constant, t is temperature and ln is the natural logarithm. Such a negative enthalpy of mixing stabilizes the solid solution through a more negative free energy of mixing $\Delta G_m$ (FIG. 4a):

$$\Delta G_m = \Delta H_m - t\Delta S_m \quad (6)$$

A negative free energy of mixing tends to promote ordering through alternating C-D atoms and, if strong enough, will create an ordered compound at some fixed stoichiometry most likely at a congruent maximum melting temperature.

If the enthalpy of the C-D bond is higher than the average of the C—C and D-D bonds, then the enthalpy of mixing is positive (less thermodynamically favorable) and it counteracts the free energy contribution of the entropy of mixing (FIG. 4b) creating more segregation into C- and D-rich clusters and possibly an indifferent point with a minimum melting temperature. For a large positive enthalpy of mixing, the free energy curve has two local minima and complete phase separation results (FIG. 4C). A full understanding of the free energy of solidification also requires inclusion of the free energy of solidification of the two end members at the given temperature as well as the entropy of mixing of the liquid.

In FIG. 5A the classic indifferent point with minimum congruent melting is depicted where the positive enthalpy of mixing cancels out the free energy contribution of the entropy of mixing at the melting point. In this case, the differential between entropy and enthalpy contributions remains sufficiently low as the temperature is reduced further such that no spinodal decomposition is seen and there is a continuous solid solution (ss) at all temperatures. In FIG. 5B the positive enthalpy of mixing dominates at lower temperatures where the ions are still mobile and phase separation through spinodal decomposition occurs. The two phases are γ, a solid solution of D in C, and δ, a solid solution of C in D. In FIG. 5C the spinodal has risen to the melting temperature and there is no longer congruent melting, though there is complete solid solubility at the melting point. In FIG. 5D the positive heat of mixing dominates completely and phase separation into a eutectic occurs.

As above, a phase diagram with a minimum congruently melting indifferent point is depicted in FIG. 5A. When the free energy contribution of the enthalpy of mixing is greater than the contribution of the entropy of mixing, the clustering will become more extreme, resulting in the solid solution separating into two solid solutions γ (D in C) and δ (C in D) with phase separation and a eutectic, as is seen in FIGS. 5C and 5D. Because of the precise nature of the condition to form an indifferent point, it is a relatively uncommon occurrence when this condition is satisfied exactly. Also, there can still be phase separation of the solid solution below the solidus and this can result in solid phase spinodal decomposition/phase separation that is generally destructive if it occurs at a temperature where the ions are sufficiently mobile for the transformation to occur. This is depicted in FIG. 5B. Therefore, returning a congruently grown crystal intact to room temperature either requires that the decomposition temperature be below room temperature or at such a low temperature that the atoms are "frozen" in place and phase separation in any realistic time is kinetically impossible. This further constrains which systems can successfully produce crystals. The thermodynamics of compounds with multiple ions such as the oxide perovskites are more complex, but the principles are still the same.

Known Perovskite Solid Solutions with an Indifferent Point

BaTiO$_3$—CaTiO$_3$—

Such a congruent minimum is depicted in FIG. 6 for a continuous solid solution between the perovskites barium titanate with approximate molar chemical formula BaTiO$_3$ and calcium titanate with approximate molar chemical formula CaTiO$_3$.

The continuous solid solution Ba$_{(1-x)}$Ca$_x$TiO$_3$ has a cubic perovskite structure at high temperature, but the congruent composition transforms to a tetragonal phase at 98° C. most likely because the perovskite tolerance factor T=1.04. The liquidus is drawn between the points of last melting on heating (solid diamonds) and first crystallization on cooling (open diamonds). This hysteresis typically occurs from a combination of furnace hysteresis and the need for melting/crystallization to be driven by a slight degree of superheating/supercooling. The solidus is drawn from x-ray fluorescence (XRF) data on crystals grown from melts with x=0.1, 0.2 and 0.3 (crosses). (C. Kuper, R. Pankrath, and H. Hesse, Appl. Phys. A: Mater. Sci. Process, A65 (1997) 301). The phase diagram of FIG. 6 displays an indifferent point where the liquidus and solidus curves come together at a congruently melting minimum at a fixed proportion. Because of the high temperatures involved, it is impossible to characterize exactly whether or how the high temperature cubic solid solution phases on the right and left sides of the congruent point may differ.

The congruent nature of this material was verified by other authors by the growth of single crystals and determination of the uniformity of composition along the crystal length. No distinction is made by the authors between the high temperature cubic phases on the right and left sides of the congruent point. The congruent composition transforms to a tetragonal phase at 98° C. so this material is not appropriate as a substrate. This A$_x$A'$_{1-x}$BO$_3$ solid solution has A=Ca and A'=Ba with the same valence 2+ and B=Ti in the 4+ valence state.

BaTiO$_3$—NaNbO$_3$—

The continuous solid solution perovskite between barium titanate with approximate molar chemical formula BaTiO$_3$ (BT) and sodium niobate with approximate molar chemical formula NaNbO$_3$ (NN), BT-NN, has been identified as having a similar congruently melting minimum.

FIG. 7 illustrates a pseudo-binary phase diagram of NaNbO$_3$—BaTiO$_3$. (D. E. Rase and R. Roy, ACerS-NIST Ceramic Phase Equilibria Diagrams, Version 4.0, American Ceramic Society and National Institute of Standards and Technology, (2014), Phase Diagram 00826 originally from Eighth Quarterly Progress Report (April 1 to Jun. 30, 1953), Vol. Appendix II, p. 16 (1953)). The continuous solid solution between the perovskites sodium niobate $NaNbO_3$ (NN) and barium titanate $BaTiO_3$ (BT) was first identified as having a congruently melting minimum in this reference with a minimum near 60 mole percent $BaTiO_3$, which has a less favorable perovskite tolerance factor T=1.023.

FIG. 8 is a pseudo-binary phase diagram of the continuous solid solution $NaNbO_3$—$BaTiO_3$. (Merrill W. Schaefer "Phase Equilibria in the $Na_2O$—$Nb_2O_5$ and $NaNbO_3$—$BaTiO_3$ Systems, and the Polymorphism of $NaNbO_3$ and $Nb_2O_5$," Ph.D. thesis, The Pennsylvania State University (August, 1956)). Melting solidus and liquidus curves obtained by differential thermal analysis show a congruently melting minimum in the solid solution near 50 mol percent $BaTiO_3$, which differs from FIG. 7, and has a perovskite tolerance factor T=1.014. The phase diagram of the reference in FIG. 7 and the Schaefer thesis do not identify any phase change or phase difference in the solid solution between the two sides of the congruent point other than the $BaTiO_3$ phase change near the end member $BaTiO_3$ melting point, which will not impact the intermediate solid solution range of interest. No single crystals of this material were grown.

The available melting curve phase diagrams in FIG. 7 and FIG. 8 differ in the position of the congruent point between 50 and 60 mole percent $BaTiO_3$ (x=0.5-0.6), which respectively have tolerance factors T of 1.014 and 1.023. This material has not been grown in single crystal form and nothing further about it is given in the literature beyond its initial discovery. No determination of the high temperature phase structure has been made. This material is a solid solution on both A and B sites $A_xA'_{1-x}B_xB'_{1-x}O_3$ where A=Ba and A'=Na and B=Ti and B'=Nb have differing valences and therefore must be matched in proportion with x=y if the conditions are met that the compound is stoichiometric, all ions are single site and there are no significant vacancies or other stoichiometry defects.

$LaAlO_3$—$SrAl_{1/2}Ta_{1/2}O_3$—

A substrate material of technological importance that has this type of continuous solid solution congruent minimum is the cubic perovskite LSAT (listed in the bottom of FIG. 1 as a substrate), which is a solid solution between a simple perovskite lanthanum aluminate with approximate molar chemical formula $LaAlO_3$ and a complex perovskite strontium aluminum tantalate with approximate molar chemical formula $SrAl_{1/2}Ta_{1/2}O_3$. The composition is given as $xLaAlO_3$-$(1-x)SrAl_{1/2}Ta_{1/2}O_3$ or $La_xSr_{1-x}Al_{(1+x)/2}Ta_{(1-x)/2}O_3$, and this compound has a previously measured congruently minimum melting temperature of ~1820° C. at x≈0.25. This is a more complex solid solution because Al is in both end members, but is not the only B ion. The proportions are constrained to a single variable x by the ionic valences and the fact that all species are single site ions. The congruent nature of this material was verified by the growth of single crystals, determination of the uniformity of composition along the crystal length and comparison to the residual melt. No determination of the high temperature phase structure has been made. This material has a reported lattice parameter of ~0.3865 nm, below the targeted range discussed previously, and is used as a substrate for high temperature superconductors and other applications.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, the present disclosure provides a single-crystal perovskite comprising a solid solution between two perovskite compounds having an indifferent melting point that occurs at a temperature minimum in a melting curve in a pseudo-binary phase diagram.

In an embodiment, the single-crystal perovskite excludes:

a solid solution of barium titanate-calcium titanate with an approximate molar chemical formula $xBaTiO_3$-$(1-x)CaTiO_3$, wherein x is in a range between 0 and 1;

a solid solution of lanthanum aluminate-strontium aluminum tantalate with an approximate molar chemical formula $xLaAlO_3$-$(1-x)SrAl_{0.5}Ta_{0.5}O_3$, wherein x is in a range between 0 and 1; and a solid solution of barium titanate-sodium niobate with an approximate molar chemical formula $xBaTiO_3$-$(1-x)NaNbO_3$ wherein x is in a range between 0.45 and 0.65 and the perovskite tolerance factor, T, is in a range between 1.009 and 1.028.

In an embodiment, the solid solution between two perovskite compounds is selected from the group of consisting of:

a solid solution of barium titanate-sodium tantalate with an approximate molar chemical formula $xBaTiO_3$-$(1-x)NaTaO_3$, wherein x is in a range between about 0.35 and about 0.75;

a solid solution of barium titanate-sodium lanthanum titanate with an approximate molar chemical formula $xBaTiO_3$-$(1-x)Na_{0.5}La_{0.5}TiO_3$, wherein x is in a range between about 0.15 and about 0.55;

a solid solution of strontium titanate-sodium tantalate with an approximate molar chemical formula $xSrTiO_3$-$(1-x)NaTaO_3$, wherein x is in a range between about 0.2 and about 0.6;

a solid solution of strontium titanate-sodium lanthanum titanate with an approximate molar chemical formula $xSrTiO_3$-$(1-x)Na_{0.5}La_{0.5}TiO_3$, wherein x is in a range between about 0.05 and about 0.45; and a solid solution of sodium niobate-barium lithium niobate with an approximate molar chemical formula $xNaNbO_3$-$(1-x)BaLi_{0.25}Nb_{0.75}O_3$, wherein x is in a range between about 0.21 and about 0.61.

In another aspect, the present disclosure provides a structure comprising: a single-crystal perovskite comprising a solid solution between two perovskite compounds having an indifferent melting point that occurs at a temperature minimum in a melting curve in a pseudo-binary phase diagram; and an epitaxial single crystal epitaxially disposed on the single perovskite crystal.

In another aspect, the present disclosure provides a device comprising an epitaxial single crystal as described herein.

In another aspect, the present disclosure provides a method of making a single-crystal perovskite. In an embodiment, the method includes drying single-crystal perovskite reagents to remove moisture and adsorbed gases from the single-crystal perovskite reagents; combining the single-crystal perovskite reagents to provide a mixture; compacting the mixture; melting the mixture to provide a liquid solution between two perovskite compounds having an indifferent melting point; and generating a temperature gradient within the mixture configured to nucleate and grow the perovskite single crystal, wherein the single-crystal perovskite comprises a solid solution between two perovskite compounds having an indifferent melting point that occurs at a temperature minimum in a melting curve in a pseudo-binary phase diagram.

In an embodiment, the method further comprises epitaxially growing an epitaxial single crystal on one or more surfaces of the single-crystal perovskite.

In another aspect, the present disclosure provides a single-crystal perovskite made according to the methods described herein.

DESCRIPTION OF THE DRAWINGS

The foregoing aspects and many of the attendant advantages of claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
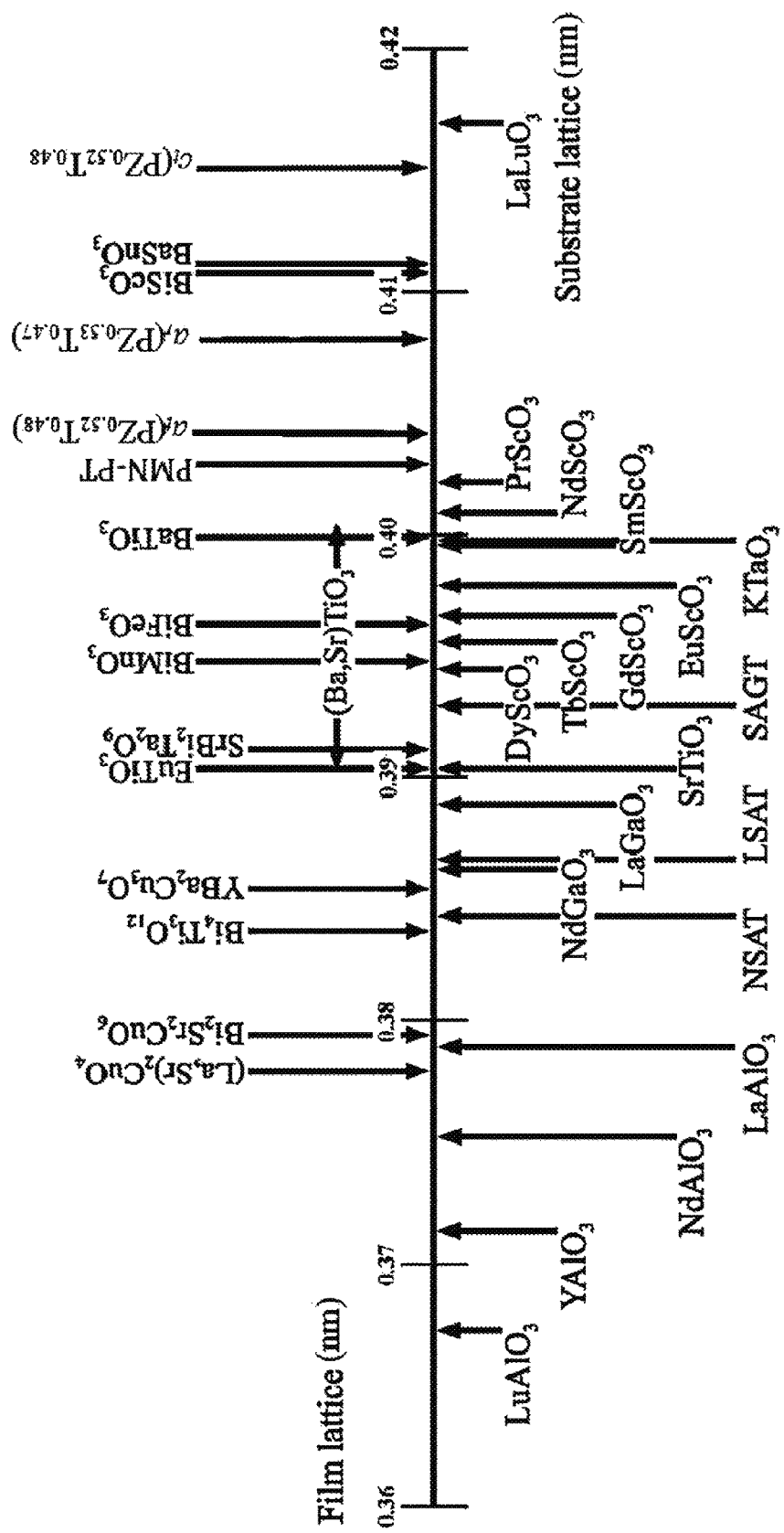
FIG. 1 graphically illustrates lattice parameters of some desired epitaxial single crystal films of the perovskite crystal structure (above the number line) and currently available substrate materials having a perovskite crystal structure (below the number line)
Figure 2:
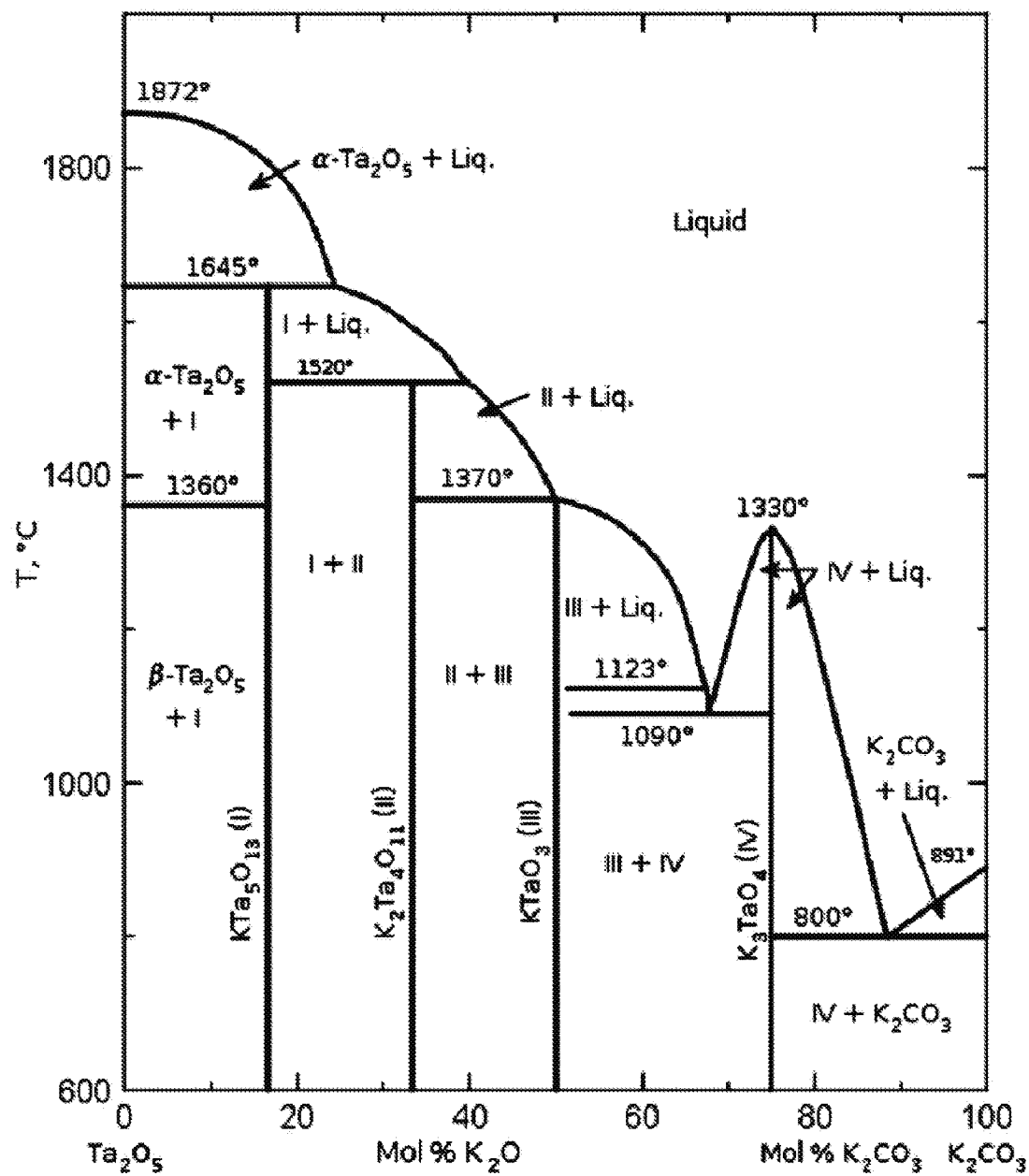
FIG. 2 is a pseudo-binary phase diagram of the system $K_2CO_3$—$K_2O$—$Ta_2O_5$.
Figure 3:
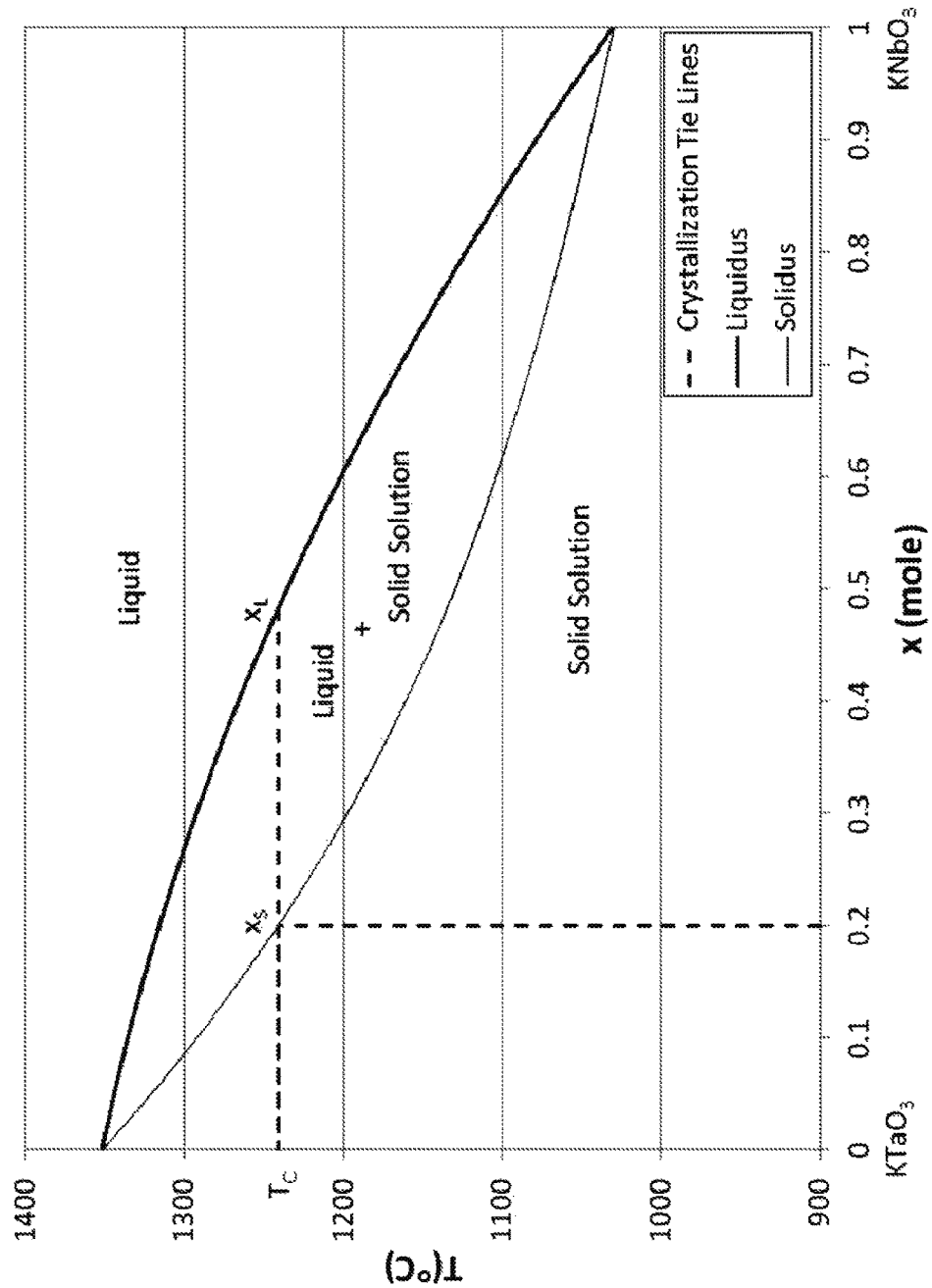
FIG. 3 is a pseudo-binary phase diagram of the system $KTaO_3$—$KNbO_3$.

The present disclosure relates generally to single-crystal perovskite solid solutions, structures and devices including single-crystal perovskite solid solutions, and methods of making single-crystal perovskite solid solutions. As described further herein, epitaxial growth of single crystals frequently requires a substrate having a suitable structural and lattice parameter match to the single crystal. Prior to the present disclosure, there was a dearth of substrates for epitaxial growth of perovskite crystals having a primitive lattice parameter between about 0.387 nm and about 0.412 nm. FIG. 1 shows a prior art plot of lattice parameters of available perovskite substrates (bottom of FIG. 1) and epitaxial film compounds having perovskite crystal structure that are of interest and might be grown on the single-crystal perovskite substrates (top of FIG. 1). Lattice parameters of lead zirconate titanate in the tetragonal ($a_t(PZ_{0.52}T_{0.48})$ and $c_t(PZ_{0.52}T_{0.48})$) and rhombohedral ($a_r(PZ_{0.53}T_{0.47})$) phases near the morphotropic phase boundary have been added.

In an embodiment, the present disclosure specifically addresses the need for substrates with the perovskite crystal structure in the range of simple $ABO_3$ perovskite lattice parameters $a°$=0.387-0.407 nm or multiples thereof by an integer or, in the case of a rotated unit cell, of $\sqrt{2}$, $\sqrt{3}$ or $\sqrt{6}$.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Single-Crystal Perovskites

In one aspect, the present disclosure provides a single-crystal perovskite comprising a solid solution between two perovskite compounds having an indifferent melting point that occurs at a temperature minimum in a melting curve in a pseudo-binary phase diagram. A melting curve on a phase diagram is a compilation of the liquidus (point of last solid melting on heating and first solid formation on cooling) and solidus (point of first liquid formation on heating and last liquid solidification on cooling). If these two curves come together at a temperature minimum or maximum, this constitutes an indifferent point and represents a congruent composition. Other features may occur at lower or higher temperatures such as phase changes and solid or liquid phase separation. These are not relevant to determination of an indifferent point. A phase diagram is binary when there are only two constituents and only one compositional variable is possible. When there are more constituents, more complex constituents or more variables, such as growth atmosphere, a pseudo-binary phase diagram may be selected where all variable but one are kept constant and only the change in that variable is plotted. Complex perovskite solid solutions are generally plotted on such pseudo-ternary phase diagrams, because other variables such as pressure and oxygen stoichiometry are effectively constant. Data points on such a phase diagram may be measured by visual observation, differential scanning calorimetry or other thermodynamic metrics. However, it is not necessary to generate an entire phase diagram to demonstrate congruency. The ability to generate a solid of constant or approximately constant composition throughout the process of solidification is sufficient and may be further reinforced by a local temperature minimum or maximum.

In an embodiment, the single-crystal perovskite excludes a solid solution of barium titanate-calcium titanate with an approximate molar chemical formula $xBaTiO_3$-$(1-x)CaTiO_3$, wherein x is in a range between 0 and 1; a solid solution of lanthanum aluminate-strontium aluminum tantalate with an approximate molar chemical formula $xLaAlO_3$-$(1-x)SrAl_{0.5}Ta_{0.5}O_3$, wherein x is in a range between 0 and 1; and a solid solution of barium titanate-sodium niobate with an approximate molar chemical formula $xBaTiO_3$-$(1-x)NaNbO_3$, wherein x is in a range between 0.45 and 0.65 and a perovskite tolerance factor, T, is in a range between 1.009 and 1.028.

In an embodiment, the solid solution has a cubic perovskite crystal structure. Typically, this results from a perovskite tolerance factor near 1.00. Accordingly, in an embodiment, a perovskite tolerance factor, T, of the single-crystal perovskite as calculated from Equation (1) using tabulated crystal radii is between about 0.98 and about 1.02. This can contribute to a thermodynamic energy minimum and it was found that this can shift the melting point depression curves of the end members' solid solutions and, therefore, the position of the minimum. Uniformly, the tolerance factor of the indifferent point of the single-crystal perovskite crystals described herein was, at worst, the same, and mostly closer to unity than the predicted value.

In an embodiment, one or more of the end member compounds of the solid solutions described herein are not cubic, but blending compounds of higher and lower tolerance factors achieves a solid solution with T close to unity in the mixture that favors a cubic structure of the solid solution at the congruent composition. In an embodiment, a composition of end member perovskites is within about 1 atomic percent of nominal integer values of a primitive formula unit.

As discussed further herein, it was found that the free energy contribution of the tolerance factor tended to make the indifferent point occur closer to a tolerance factor of unity. In an embodiment, the single-crystal perovskite is of cubic crystal structure at room temperature. In an embodiment, the single-crystal perovskite is of cubic crystal structure between at least about 273° K and about 298° K.

In an embodiment, the single-crystal perovskite comprises a solid solution of barium titanate-sodium tantalate with an approximate molar chemical formula $xBaTiO_3$-$(1-x)NaTaO_3$, wherein x is in a range between about 0.35 and about 0.75. In an embodiment, x is in a range between about 0.45 and about 0.65 in the solid solution of barium titanate-sodium tantalite.

In an embodiment, the single-crystal perovskite comprises a solid solution of barium titanate-sodium lanthanum titanate with an approximate molar chemical formula $xBaTiO_3$-$(1-x)Na_{0.5}La_{0.5}TiO_3$, wherein x is in a range between about 0.15 and about 0.55. In an embodiment, x is in a range between about 0.25 and about 0.45 in the solid solution of barium titanate-sodium lanthanum titanate.

In an embodiment, the single-crystal perovskite comprises a solid solution of strontium titanate-sodium tantalate with an approximate molar chemical formula $xSrTiO_3$-$(1-x)NaTaO_3$, wherein x is in a range between about 0.2 and about 0.6. In an embodiment, x is in a range between about 0.3 and about 0.5 in the solid solution of strontium titanate-sodium tantalate.

In an embodiment, the single-crystal perovskite comprises a solid solution of strontium titanate-sodium lanthanum titanate with an approximate molar chemical formula $xStTiO_3$-$(1-x)Na_{0.5}La_{0.5}TiO_3$, wherein x is in a range between about 0.05 and about 0.45. In an embodiment, x is in a range between about 0.15 and about 0.35 in the solid solution of strontium titanate-sodium lanthanum titanate.

In an embodiment, the single-crystal perovskite comprises a solid solution of sodium niobate-barium lithium niobate with an approximate molar chemical formula $xNaNbO_3$-$(1-x)BaLi_{0.25}Nb_{0.75}O_3$, wherein x is in a range between about 0.21 and about 0.61. In an embodiment, x is in a range between about 0.31 and about 0.51 in the solid solution of sodium niobate-barium lithium niobate.

In an embodiment, the single-crystal perovskite comprises a solid solution between barium titanate and sodium niobate with an approximate molar chemical formula $xBaTiO_3$-$(1-x)NaNbO_3$. In an embodiment, x is in the range between about 0.22 and about 0.42. In an embodiment, x is in the range between about 0.27 and about 0.37. In an embodiment, a perovskite tolerance factor, T, is in the range between about 0.988 and about 1.006.

In an embodiment, one or both of the two perovskite compounds of the solid solution are stable end member compounds. In an embodiment, one or both of the two perovskite compounds of the solid solution are congruently melting.

In an embodiment, the components of the two perovskite compounds have compatible crystal ionic sizes. For example, aluminum on the B-site is not compatible with barium on the A-site, as Al is too small for the octahedral site in a Ba-based perovskite. On the other hand, lithium is too large for the octahedral site in a Sr-based perovskite. Accordingly, in an embodiment, the two perovskite compounds have one or more common ions. In an embodiment, the two perovskite compounds have similarly-sized A-site ions. In an embodiment, the two perovskite compounds have similarly-sized sized B-site ions.

In an embodiment, the components of the two perovskite compounds have low to moderate vapor pressure. In this regard, a liquid solution including the two perovskite compounds is stabilized at elevated temperatures, such as during making the single perovskites described herein. In an embodiment, the components of the two perovskite compounds lose no more than 10% of their total initial weight during melting, equilibration, and crystal growth at the congruently melting minimum temperature. Melting and equilibration generally occur no more than 100° C. above the crystal growth temperature. In practice, the vapor pressures of species, such as sodium and potassium, can be compensated for by adding an extra amount of these components above a minimum amount required for a congruently melting composition, adjusting the oxygen concentration of the atmosphere, or using a closed vessel. In an embodiment, the vapor pressure tin and indium are too high to be used. In an embodiment, nickel oxide may be used without excessive evaporation for compounds that melt below 1600° C. and can be grown from a platinum crucible in air.

In an embodiment, the two perovskite compounds are not excessively refractory. Zirconates, for example, are well known perovskites, but have such high melting points that they can be difficult to grow in bulk by practical means. Scandium- and magnesium-containing compounds can be, likewise, difficult to grow using bulk methods. Reasons for this are multi-fold. 1) An indifferent point cannot be achieved if the two components have too high a difference in melting temperatures. 2) Constituents such as Ti, Nb, and Ta can be reduced at high temperatures, so a melting temperature is desired <1800° C. and preferentially <1600° C. where a platinum crucible and air or other oxidizing atmosphere can be used. 3) Higher temperatures increase the vapor pressure of moderately volatile constituents.

In an embodiment, the lattice parameter of the perovskite solid solution is between about 0.385 and about 0.412 nm. In an embodiment, the lattice parameter of the perovskite solid solution is between about 0.390 nm and about 0.41 nm. In this regard, the single-crystal perovskites described herein meet the need for commercially-available substrates for epitaxial growth.

In an embodiment, the two perovskite compounds have limited concentrations of ions observed to result in distortion or phase separation. In an embodiment, the two perovskite compounds have limited concentrations of Al in Ba-containing compounds, due to phase separation. In an embodiment, the two perovskite compounds have limited concentrations of Ga, due to phase separation. In an embodiment, the two perovskite compounds have limited concentrations of Li in Sr-containing compounds, due to non-cubic distortion.

In an embodiment, the ions of the two perovskite compounds do not include the same valence on a single site. While BT-CT is a successful solid solution with an indifferent point, having ions of the same valence on a single site was generally not a good strategy for more complex solutions, particularly if it involved same-valence cations on both the A and B sites. Only one such same valence solid solution between Ba and Sr was found to have a congruent composition.

In an embodiment, the solid solution has a melting temperature less than about 1600° C. This permits growth from, for example, a crucible comprising platinum, a platinum alloy, a platinum composite, or a platinum alloy composite and, therefore, growth in air, oxygen, or other oxidizing atmosphere.

In an embodiment, the single-crystal perovskite has a diameter of between about 10 mm and about 100 mm. In an embodiment, the single-crystal perovskite has a diameter of between about 10 mm and about 50 mm. In an embodiment, the single-crystal perovskite has a diameter of between about 10 mm and about 25 mm.

In an embodiment, the single-crystal perovskite has a length of between about 10 mm and about 100 mm. In an embodiment, the single-crystal perovskite has a length of between about 10 mm and about 50 mm. In an embodiment, the single-crystal perovskite has a length of between about 10 mm and about 20 mm. single-crystal perovskite In the foregoing, the term "approximately" is as defined previously. It will be understood by those knowledgeable in the art that, although integer and integer fraction values are given for the various components, in real materials there is some entropic disorder including vacancies (mainly oxygen) and anti-site ions that can vary these stoichiometry values by up to 10 atomic percent of the five atoms in the primitive formula unit in some perovskites, but typically only up to 1 atomic percent in the perovskites described herein. Therefore, in another embodiment, the composition of the liquid solution and the solid solution of these single-crystal perovskites can vary up to 1 atomic percent for each constituent from the claimed composition of all ions in the primitive formula unit.

TABLE I contains a list of certain compounds tested or that are otherwise discussed herein. In an embodiment, the two perovskite compounds of the solid solutions described herein are chosen from the compounds listed in TABLE I.

TABLE I certain targeted end member compounds and their properties, including: abbreviation used herein (Abb); chemical formula; crystal structure (CS: cu = cubic, tet = tetragonal, o = orthorhombic, r = rhombohedral, h = hexagonal and pc = pseudo-cubic where the exact crystal structure is undetermined); lattice parameters, a, b and c; pseudo-cubic lattice parameter, $a_{pc}$; calculated hard sphere lattice parameter, $a_{hs}$ (not adjusted for tolerance factor T or ionic size); tolerance factor, T; melting temperature, $t_m$; and congruency (Cong: co = congruent, p = peritectic, sl = slightly incongruent, n = not congruent, and u = unknown). Starred melting temperatures are estimated.

| Abb | Formula | CS | a (nm) | b (nm) | c (nm) | $a_{pc}$ (nm) | $a_{hs}$ (nm) | T | $t_m$ (° C.) | Cong |
|---|---|---|---|---|---|---|---|---|---|---|
| NN | $NaNbO_3$ | o | 0.5513 | 0.5571 | 0.7766 | 0.3907 | 0.4013 | 0.967 | 1425 | co |
| NT | $NaTaO_3$ | o | 0.5481 | 0.5524 | 0.7795 | 0.3893 | 0.4013 | 0.967 | 1810 | co |
| KN | $KNbO_3$ | o | 0.5695 | 0.5721 | 0.3974 | 0.4015 | 0.4190 | 1.054 | 1071 | p |
| KT | $KTaO_3$ | cu | 0.3988 | | | 0.3988 | 0.4190 | 1.054 | 1368 | p |
| CT | $CaTiO_3$ | o | 0.5404 | 0.5422 | 0.7651 | 0.3827 | 0.3942 | 0.966 | 1975 | co |
| ST | $SrTiO_3$ | cu | 0.3903 | | | 0.3903 | 0.4013 | 1.002 | 2060 | co |
| BT | $BaTiO3$ | tet | 0.4000 | | 0.4024 | 0.4008 | 0.4133 | 1.062 | 1625 | co |
| LA | $LaAlO_3$ | r | 0.5359 | | | 0.3789 | 0.3887 | 1.009 | 2110 | co |
| LG | $LaGaO_3$ | o | 0.5491 | 0.5523 | 0.7773 | 0.3892 | 0.3972 | 0.966 | 1698 | co |
| SAN | $SrAl_{0.5}Nb_{0.5}O_3$ | cu | 0.7795 | | | 0.3898 | 0.3996 | 1.010 | 1790 | co |
| SAT | $SrAl_{0.5}Nb_{0.5}O_3$ | cu | 0.7795 | | | 0.3898 | 0.3996 | 1.010 | 1980 | co |
| SGT | $SrGa_{0.5}Ta_{0.5}O_3$ | cu | 0.7898 | | | 0.3949 | 0.4038 | 0.989 | 1820 | co |
| BGN | $BaGa_{0.5}Nb_{0.5}O_3$ | pc | 0.4038 | | | 0.4038 | 0.4158 | 1.048 | 1500 | sl |
| BGT | $BaGa_{0.5}Ta_{0.5}O_3$ | pc | 0.4038 | | | 0.4038 | 0.4158 | 1.048 | 1690 | sl |
| NLT | $Na_{0.5}La_{0.5}TiO_3$ | o | 0.5479 | 0.5487 | 0.7747 | 0.3876 | 0.3967 | 0.979 | 1800* | u |
| KLT | $K_{0.5}La_{0.5}TiO_3$ | pc | 0.3914 | | | 0.3914 | 0.4056 | 1.023 | 1360 | n |
| SLT | $SrLi_{0.25}Ta_{0.75}O_3$ | r | 0.9811 | 0.9811 | 1.1206 | 0.4005 | 0.4078 | 0.970 | 1905 | co |
| BLT | $BaLi_{.25}Ta_{.75}O_3$ | h | 0.5802 | 0.5802 | 1.9085 | 0.4112 | 0.4198 | 1.028 | 1620* | u |
| BLN | $BaLi_{.25}Nb_{.75}O_3$ | h | 0.5803 | 0.5803 | 1.9076 | 0.4112 | 0.4198 | 1.028 | 1350* | u |

In an embodiment, the two perovskite compounds have similar melting temperatures, with a difference in melting temperatures of no greater than about 300° C. For components with the same melting temperature, a first approximation is that either an indifferent point or a eutectic will be near the equimolar point in the center of the phase diagram. As the melting temperature difference increases, there is a tendency for the temperature minimum to move closer to the lower melting constituent. At a large enough difference, the minimum reaches the melting point of the end member constituent or is so close as not to have a significantly different set of properties from the end member. Empirically this occurs for differences in end member melting temperatures >300° C.

A discussion of how the combination of the heat of mixing and the difference in the end member melting temperatures influences the melting behavior will help to explain the last point. Phase diagram construction from free energy curves for a simple two component system C-D is shown in FIG. 9. For this simple illustration, there is assumed to be no temperature dependence of the enthalpies and the solid and liquid entropies of mixing $\Delta S_m$ are assumed equal. The excess free energy of the liquid is given by its entropy of mixing.

$$\Delta G_L = -t\Delta S_m \quad (7)$$

The free energy of the solid $\Delta G_S$ is given by the linear combination of the temperature dependent free energies of the end members $(1-x)\Delta G_C + x\Delta G_D$ plus the free energy of mixing $\Delta G_m = \Delta H_m - t\Delta S_m$.

$$\Delta G_S = (1-x)\Delta G_C + x\Delta G_D + \Delta H_m - t\Delta S_m \quad (8)$$

This solid free energy curve shifts up and down as temperature is varied. The form of the enthalpy of mixing $\Delta H_m$ is assumed to be proportional to $x(1-x)$ as in Equation (4). The form of the entropy of mixing $\Delta S_m$ is assumed to be proportional to $x \ln(x) + (1-x)\ln(1-x)$ as in Equation (5). The difference among the forms of these functions and their sum and difference account for a variety of phase diagram phenomena.

Figure 9A:
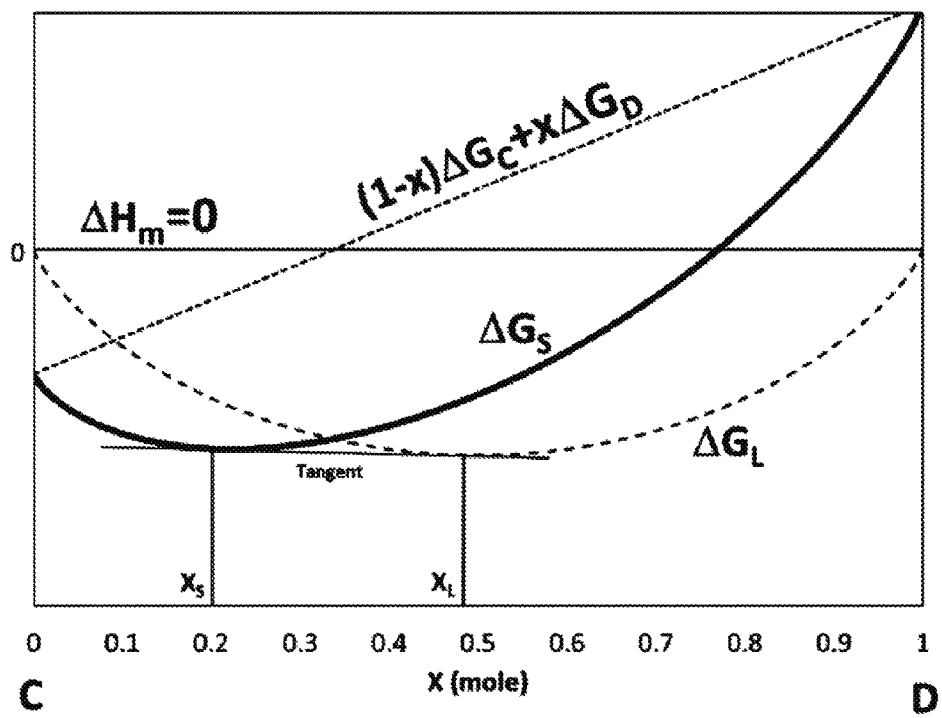
FIGS. 9A-9E illustrate exemplary phase diagram construction from free energy curves for a simple two component system C-D.

In FIG. 9A, the enthalpy of mixing is assumed to be zero so the free energy curves of the solid and liquid have the same functional form and can only be tangent at a point at the end members, x=0 and 1. Elsewhere in the phase diagram, the solid and liquid phases in equilibrium with each other are defined by the mutual tangent. Looking at these curves for all temperatures between the melting temperatures of the end members will draw out a simple solid solution phase diagram similar to FIG. 4A.

Figure 4A:
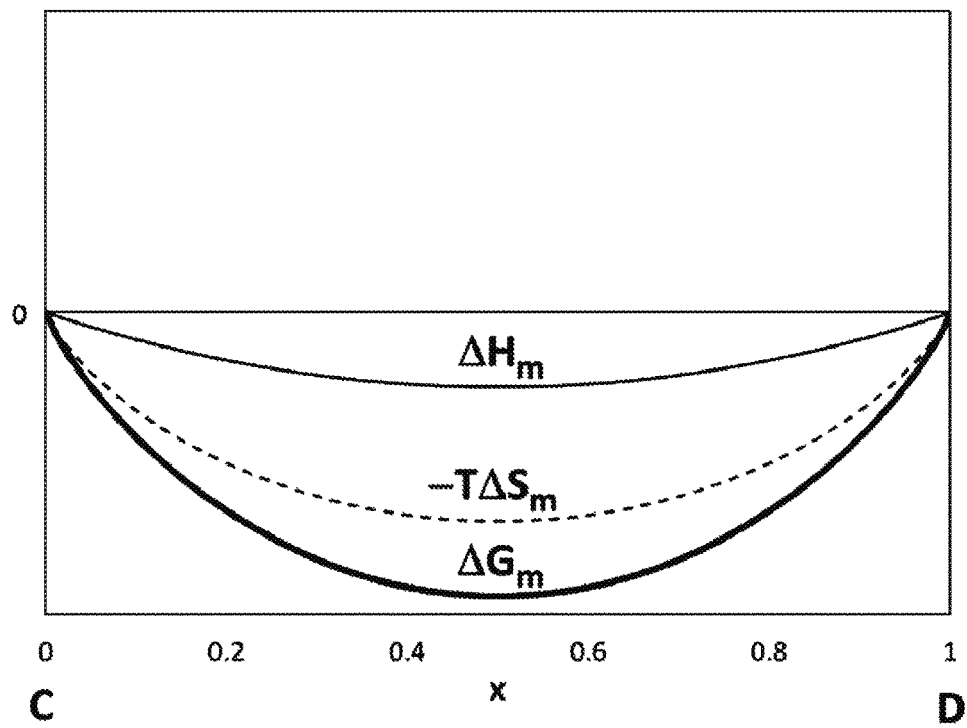
FIGS. 4A-4C illustrate contributions of (A) negative enthalpy of mixing and (B—C) positive enthalpy of mixing to the free energy of a solid solution between C and D.
Figure 9B:
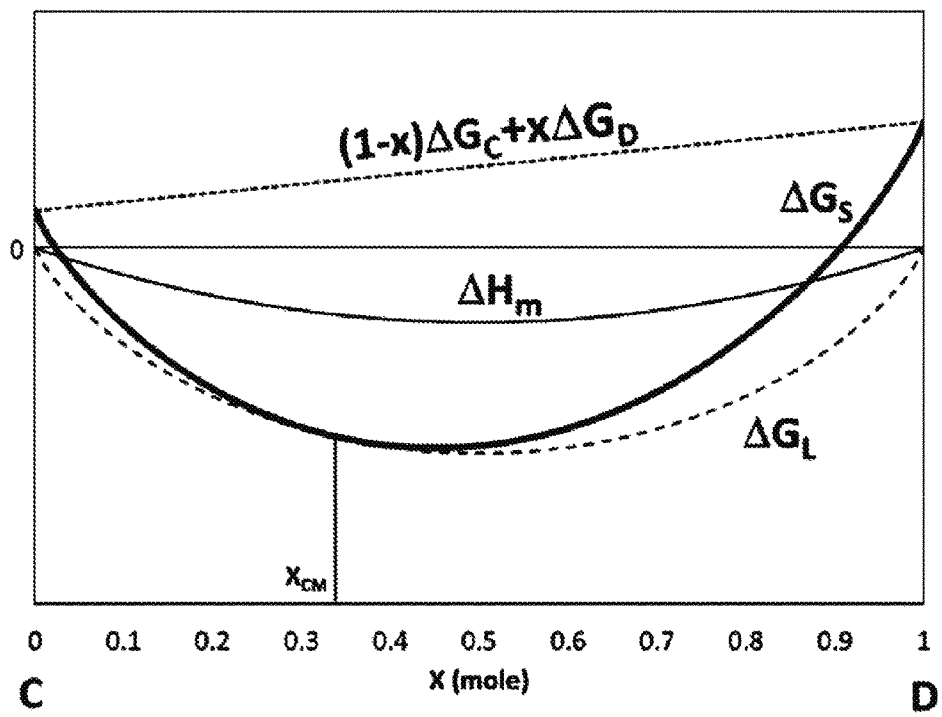

In FIG. 9B, the enthalpy of mixing is assumed to be negative as in FIG. 4A. The free energy curves of the solid and liquid have different functional forms, with the free energy of the solid being sharper, which allows the solid and liquid free energy curves to be tangent at a point where the free energy curve of the solid is above that of the liquid for all temperatures except a single point. This results in an indifferent melting point that occurs at a composition with a value of $x_{CM}$ that is at a temperature maximum in the melting curve in the pseudo-binary molar phase diagram between C and D.

Figure 4B:
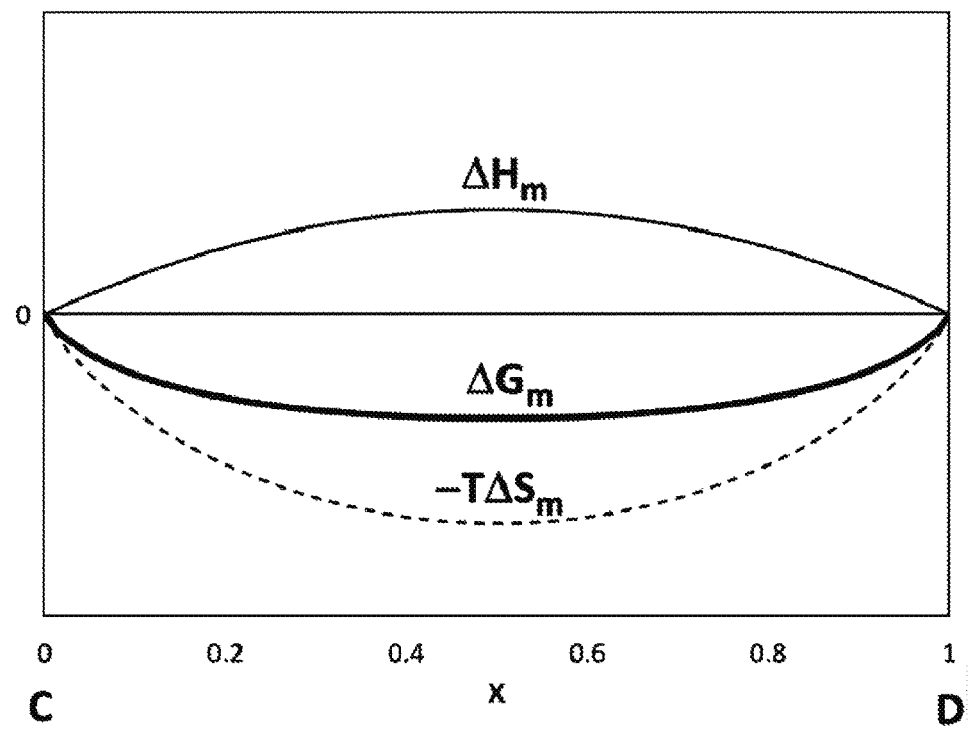
Figure 4C:
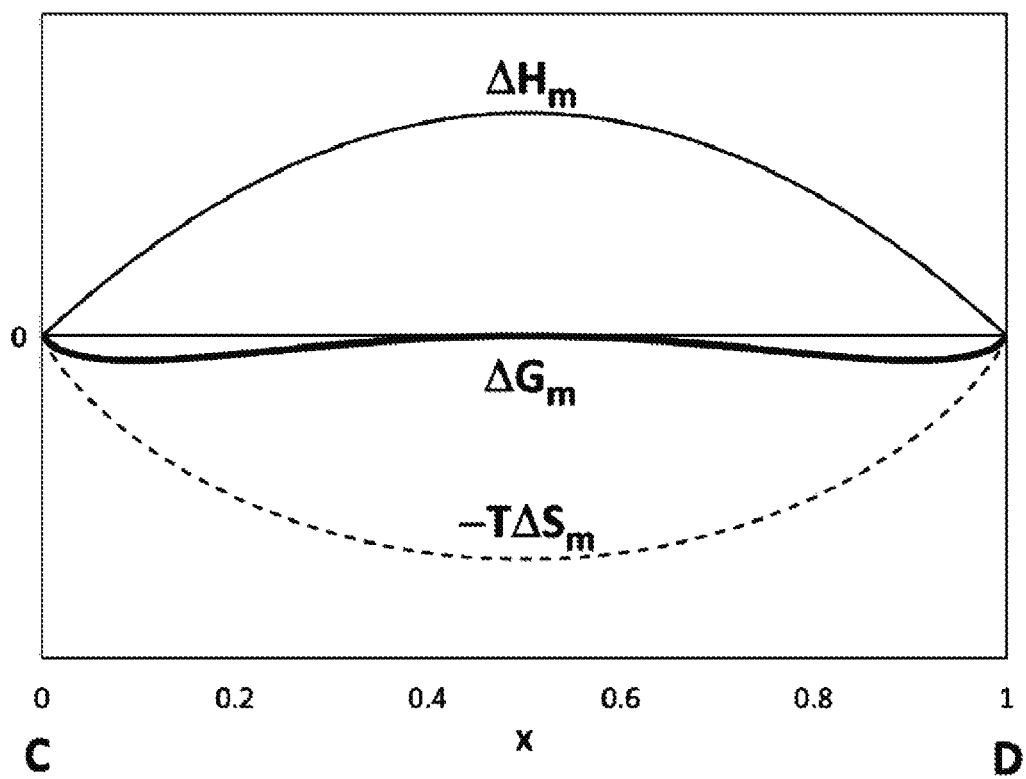
Figure 5A:
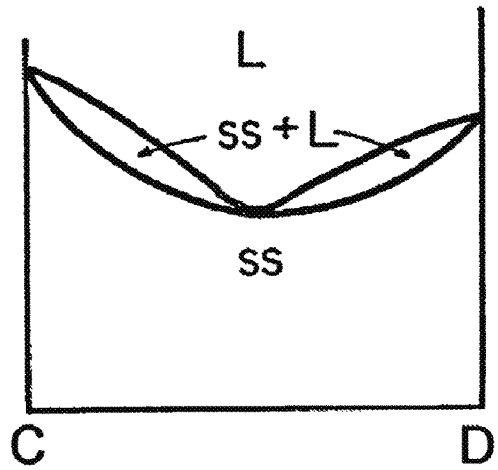
FIGS. 5A-5D illustrate the appearance of phase diagrams among compounds C, D and their molten liquid mixture (L) with increasing positive enthalpy of mixing.
Figure 5B:
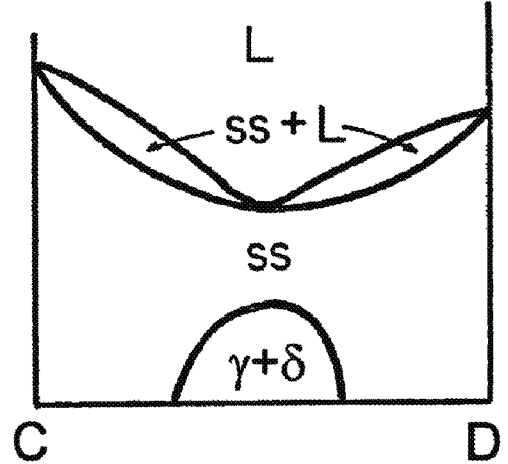
Figure 5C:
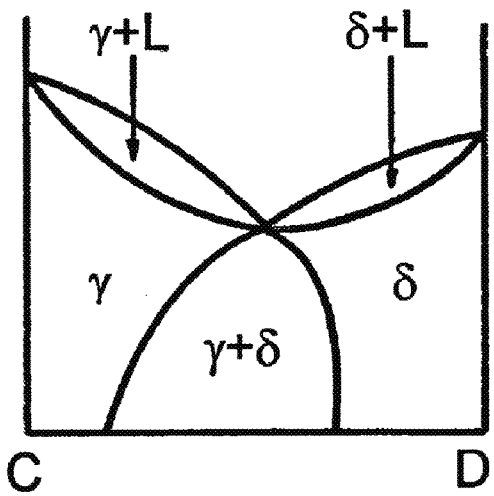
Figure 5D:
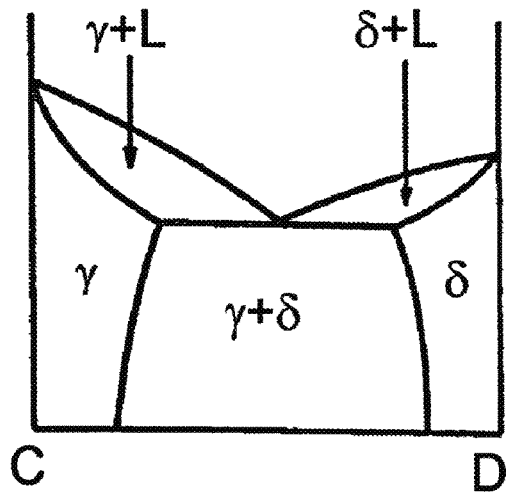
Figure 6:
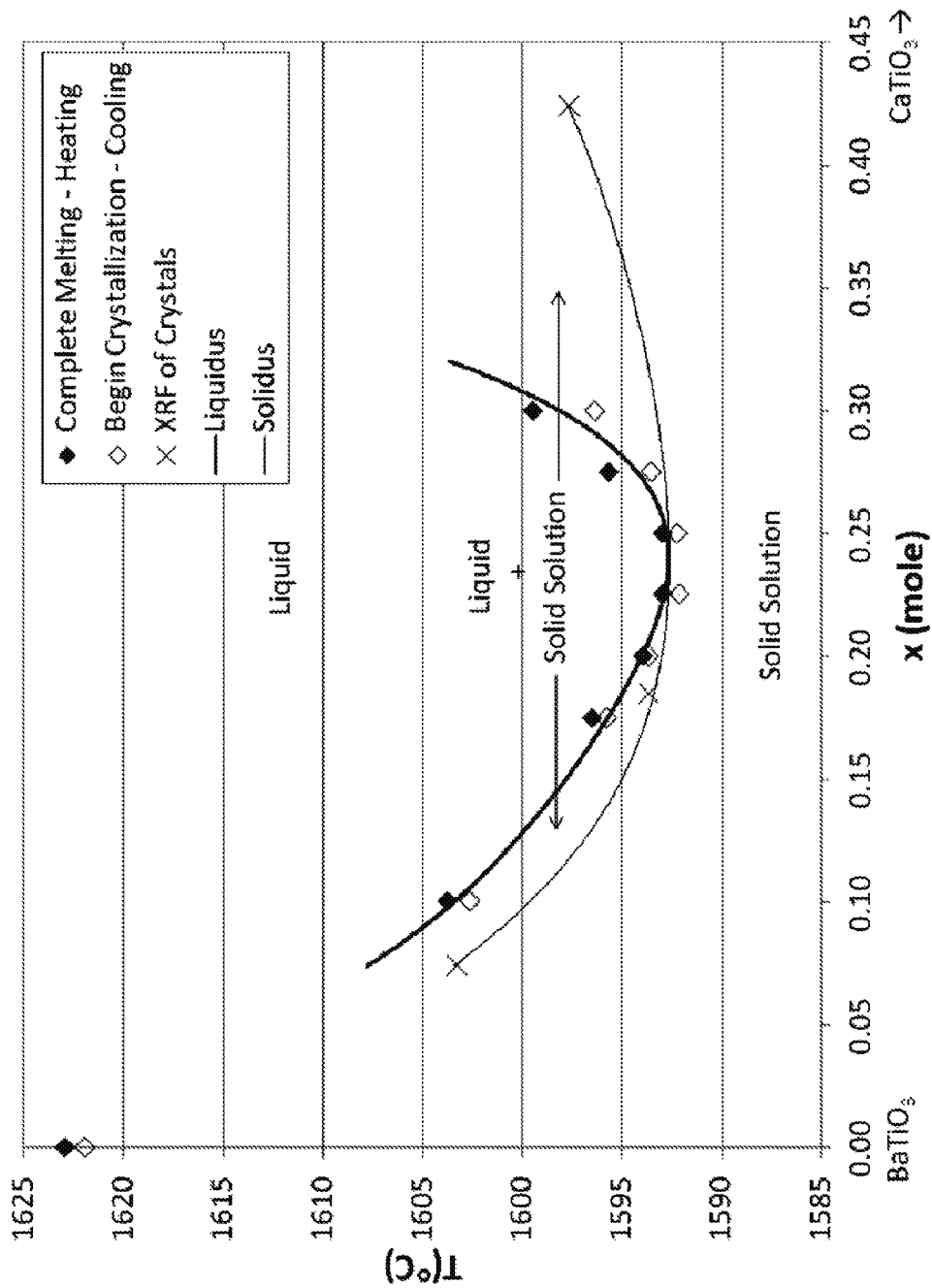
FIG. 6 is a pseudo-binary phase diagram $BaTiO_3$—$CaTiO_3$.
Figure 9C:
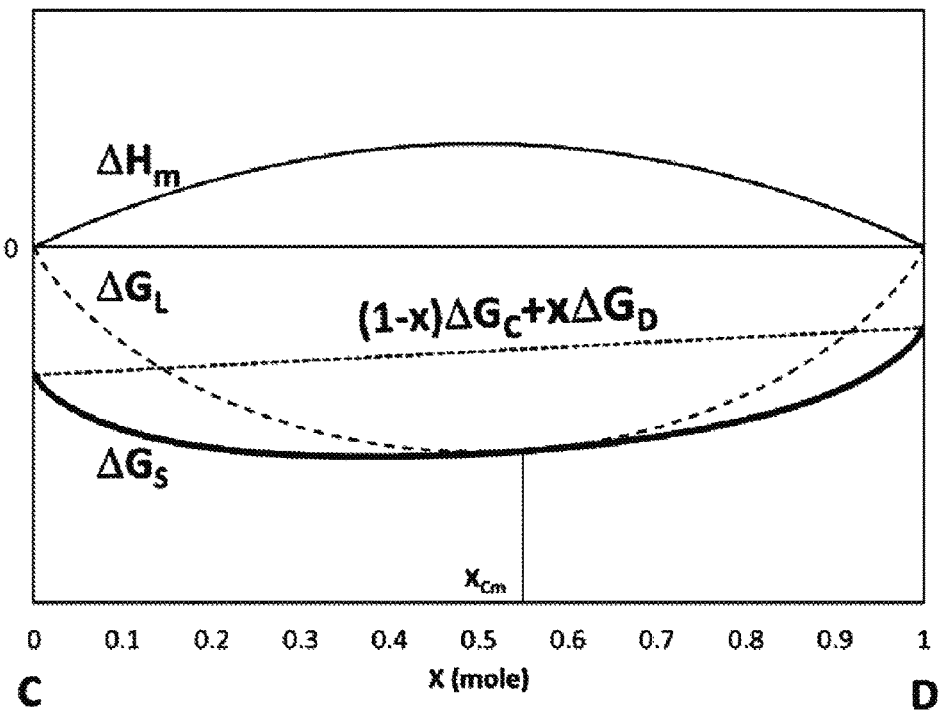
Figure 9D:
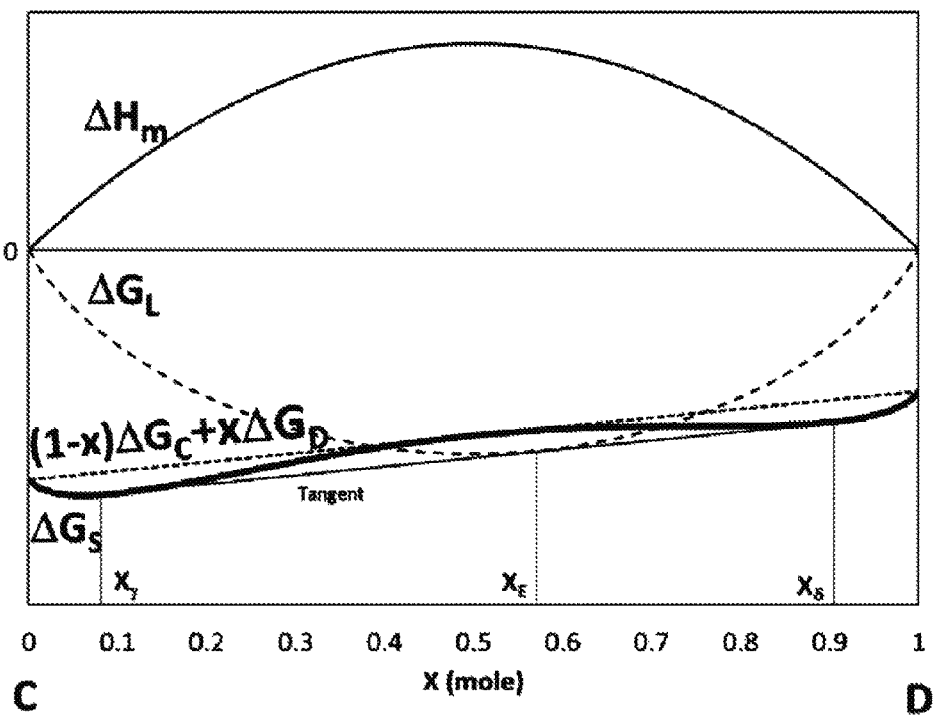

In FIG. 9C, the enthalpy of mixing is assumed to be positive as in FIG. 4B. The free energy curves of the solid and liquid now have different functional forms with the free energy of the solid being flatter, but not retrograde, which allows the solid and liquid free energy curves to be tangent at a point where the free energy curve of the solid is below that of the liquid for all temperatures except a single point. This results in an indifferent melting point that occurs at a composition with a value of $x_{Cm}$ that is at a temperature minimum in the melting curve in the pseudo-binary molar phase diagram between C and D. If the enthalpy of mixing is too large as in FIG. 9d, then the solid free energy curve has a retrograde section in the middle and the tangent between two points on the curve has a lower free energy than the central portion and phase separation into γ (D in C with $x_\gamma$) and δ (C in D with $x_\delta$) phases occurs at a eutectic composition $x_E$. This emphasizes that only a small range of values of $\Delta H_m$ satisfies the requirements to have a congruently melting minimum indifferent point.

Figure 9E:
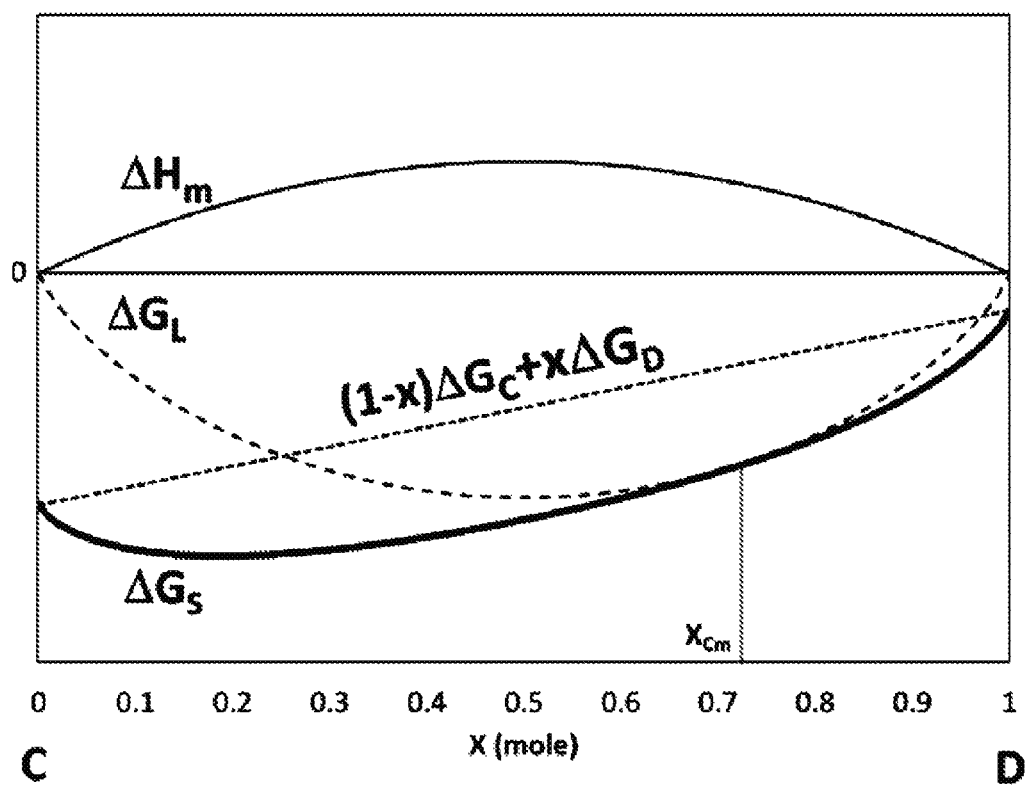

In FIG. 9C, the difference in end member melting temperatures is small, so the congruent point is near the center of the phase diagram. In FIG. 9E, the difference in end member melting temperatures is larger so the congruent point is closer to D. With a large enough difference in melting temperatures, the congruent point will reach the end member or be sufficiently close that the properties of the solid solution are not significantly different from the end member. Empirical review of a number of solid solutions shows that, while this behavior varies from system to system, a difference in melting points of ~400° C. will eliminate the congruent minimum.

Therefore, an initial estimate of the melting point $t_m(est)$ and indifferent composition $x_{est}$ was made based on the melting temperatures of the two components with initial assumptions that 1) the melting point depressions of both compounds were the same and given a value from the average of literature values and 2) the temperature difference wherein and melting minimum would reach the lower melting temperature end member is 400° C. Measured approximate values of the indifferent composition $x_m$ and melting temperature $t_m(meas)$ (where determined) differ from these somewhat with $x_m$ in particular being closer to the value where T=1. In the one case where there is literature data for the indifferent composition $x_l$ and melting temperature $t_m(lit)$, those data are recorded as well, but they differ significantly from the current determination. It was considered that any melting temperature difference greater than 300° C. would not give a congruent composition far enough away from lowest melting end member to be worth pursuing.

Those knowledgeable in the art will understand that there is a much higher level of complexity in a $xABO_3-(1-x) A'B'O_3$ solid solution than in the simple C-D example.

The entropy of mixing of the liquid will be inherently higher than the solid because of the site constraints of all three types of ions in the solid and the possibilities of oxide dissociation and multiple types of cation species with various oxygen coordinations. This changes its functional form and curve shape.

The enthalpy of mixing of the solid will depend on nearest and next-nearest neighbors among the A- and B-sites.

The tolerance factor T will contribute a free energy that is at a minimum for T=1.00. This will reinforce the entropy of mixing in the solid solution and can counteract an excess of positive enthalpy of mixing so as to eliminate phase separation. However, it will have a different functional form than any of the other free energies and is not completely understood. As will be discussed, the free energy contribution of the perovskite tolerance factor is seen to influence the melting temperature minimum to be closer to or equal to the composition where T=1.00.

Edge and volume constraints can result in internal stress within the unit cell that provides a contribution to free energy that is cannot be fully modeled without intensive computing.

The various functional forms, therefore, allow an even higher number of free energy phase diagrams than are shown in FIGS. 9A-9E.

A surprisingly large number of pairings were found to form solid solutions readily and melting point depression was measured in four of the six cases. When slowly cooled to room temperature, these compounds retained the desired cubic phase. Based, in part, on the criteria used to choose the pairs, these were mostly solid solutions with barium titanate (BT) or strontium titanate (ST). All contained Na as one of the A-site ions. All the starting chemicals are low to moderate cost.

congruently melting minima may allow solid solutions of these compounds to be stabilized. This is especially true if the compounds can be grown in air or an oxidizing atmosphere, which requires use of a platinum crucible, which in turn also requires a lower melting temperature. Nickel compounds with nickel in the 2+ valence state are among the most stable both against reduction and evaporation. It was previously found that calcium nickel niobate $CaNi_{1/3}Nb_{2/3}O_3$ (CNiN) is congruently melting at approximately 1650° C. and valence-stable against reduction with a bright green color even in a 3% oxygen atmosphere (V. J. Fratello, G. W. Berkstresser, C. D. Brandle and A. J. Ven Graitis, "Nickel Containing Perovskites," Journal of Crystal Growth Volume 166, pp. 878-882 (1996)). Solid solutions incorporating alkaline earth nickel niobates $AENi_{1/3}Nb_{2/3}O_3$ (where AE can be Ba, Sr, Ca or some solid solution among them) potentially have attractive substrate lattice parameters, especially those containing barium. However, because of unfa-

TABLE II

Examples of solid solution pairs that form indifferent minimum points.

| | | $x_m$ (±0.1) | $x_l$ | T (est) | T | a (nm) (±1%) | $t_m$ (est) (° C.) | $t_m$ (meas) (° C.) (±100° C.) | $t_m$ (lit) (° C.) |
|---|---|---|---|---|---|---|---|---|---|
| | | $x_{est}$ | | | | | | | |
| xBT | (1 − x)NN | 0.25 | 0.32 | 0.5-0.6 | 0.990 | 0.997 | 0.3958 | 1362 | 1285 | 1290-1325 |
| xBT | (1 − x)NT | 0.73 | 0.55 | | 1.036 | 1.019 | 0.3970 | 1553 | 1440 | |
| xBT | (1 − x)NLT | 0.72 | 0.35 | | 1.038 | 1.008 | 0.3920 | 1547 | 1625 | |
| xST | (1 − x)NT | 0.19 | 0.40 | | 0.974 | 0.981 | 0.3908 | 1772 | | |
| xST | (1 − x)NLT | 0.18 | 0.25 | | 0.983 | 0.984 | 0.3872 | 1766 | | |
| xNN | (1 − x)BLN | 0.41 | 0.41 | | 1.004 | 1.004 | 0.4071 | 1198 | 1300 | |

The tolerance factor at the actual indifferent point was at worst the same and mostly closer to unity than at the predicted indifferent point suggesting that the tolerance factor has a thermodynamic influence on the energy minimum. This is explicitly a new discovery and a specific teaching of this patent application.

It will be understood by those knowledgeable in the art that solid solution pairs that form indifferent points include, but are not limited to, these compositions. These constitute a broad and important class of compounds not previously described.

The compounds that failed substantially did so through formation of second phases or completely different phases altogether from the perovskites because of different combinations of the ions used. Eutectic behavior with separation into two end member perovskites was also observed in the failed pairs. However, cryoscopic examination of melted charges of the successful compositions $0.32BaTiO_3$-$0.68NaNbO_3$ and $0.41NaNbO_3$-$0.59BaLi_{0.25}Nb_{0.75}O_3$ returned to room temperature did not reveal the lamellar structure typical of eutectic crystallization.

Nickel-Containing Solid Solution Perovskites

Perovskites containing VIB-VIIIB transition metals from the fourth row of the periodic table (i.e. Cr to Ni) are known, but these perovskites tend to be unstable because these ions can take on multiple valences and be subject to evaporation at high temperatures and reducing/neutral atmospheres. These elements are magnetic in varying forms and take on a variety of valences in oxides and other compounds. The reduced temperatures allowed by indifferent points with vorable tolerance factors, none of these materials has a cubic crystal structure at room temperature. The discovery in this work that congruent melting occurs most readily near T=1.00 suggested testing solid solutions with x optimized for this condition. Table IV lists two such solid solutions based on barium nickel niobate $BaNi_{1/3}Nb_{2/3}O_3$ (BNiN). Only a single composition was prepared for each composition with the x calculated to give T=1.00. This composition was somewhat close to the estimate from melting temperatures for the solid solution with $NaNbO_3$ (NN), but was quite different for $SrNi_{1/3}Nb_{2/3}O_3$ (SNiN). Samples were prepared from component oxides that were dried, weighed to proper proportions, mixed, fired at 1000° C., ground, fired at 1200° C., reground, compressed, re-fired at 1200° C., reground and measured by x-ray diffraction. The resultant samples were both single phase cubic as is shown for BNiN—NN in Table V. While this does not establish congruent melting, it is suggestive that these compounds fill the requirements of this application. The solid solution $Ba_xSr_{1-x}Ni_{1/3}Nb_{2/3}O_3$ (BNiN—SNiN) does not contain a high vapor pressure constituent and is therefore more suitable for open crucible bulk single crystal growth methods such as the Czochralski method. This was the only solid solution with two A species of the same valence that appeared to have an indifferent point. Since niobium and tantalum are similar in valence, size and chemical behavior, past experience suggests nickel containing tantalates may behave similarly to the niobate compounds recited here. Substrates containing magnetic ions such as nickel are not suitable for some applications.

TABLE IV

Nickel-containing solid solutions that may have indifferent minimum points.

| x | (1 − x) | $x_{est}$ | T (est) (from melting temperatures) | $t_m$ (est) | $x_{est}$ (T = 1.00) | a (nm) (calc.) | a (nm) (meas.) |
|---|---|---|---|---|---|---|---|
| $BaNi_{1/3}Nb_{2/3}O_3$ | $SrNi_{1/3}Nb_{2/3}O_3$ | 0.89 | 1.028 | 1545° C. | 0.40 | 0.4012 | 0.4013 |
| $BaNi_{1/3}Nb_{2/3}O_3$ | $NaNbO_3$ | 0.33 | 0.990 | 1320° C. | 0.48 | 0.4012 | 0.4014 |

TABLE V

X-ray powder diffraction pattern taken with a Siemens D-8 diffractometer for the $BNiN_{0.48}$—$NN_{0.52}$ cubic solid solution including inter-planar d-spacings, intensity percentage with respect to the maximum (1, 1, 0) line and planar (h, k, l) indices. The d spacings have an error bar of 2% and the intensities should not be considered as precise.

| d(nm) | I % | (h, k, l) |
|---|---|---|
| 0.4005 | 5% | (1, 0, 0) |
| 0.2838 | 100% | (1, 1, 0) |
| 0.2320 | 3% | (1, 1, 1) |
| 0.2007 | 35% | (2, 0, 0) |
| 0.1798 | 2% | (2, 1, 0) |
| 0.1640 | 31% | (2, 1, 1) |
| 0.1420 | 16% | (2, 2, 0) |
| 0.1270 | 11% | (3, 1, 0) |
| 0.1159 | 4% | (2, 2, 2) |

Accordingly, in an embodiment, the single-crystal perovskites described herein comprise a solid solution comprising a solid solution of an alkaline earth (AE) metal nickel niobate perovskite with an approximate molar chemical formula $AENi_{1/3}Nb_{2/3}O_3$ with another perovskite, wherein the single-crystal perovskite has a perovskite tolerance factor, T, between about 0.98 and about 1.02. In an embodiment, the AE metal is selected from the group consisting of Ba, Sr and Ca. In an embodiment, the single-crystal perovskite comprises a solid solution between barium nickel niobate and strontium nickel niobate with an approximate molar chemical formula $xBaNi_{1/3}Nb_{2/3}O_3$-$(1-x)SrNi_{1/3}Nb_{2/3}O_3$, wherein x is in the range between about 0.2 and about 0.9. In an embodiment, the single-crystal perovskite comprises a solid solution between barium nickel niobate and sodium niobate with an approximate molar chemical formula $xBaNi_{1/3}Nb_{2/3}O_3$-$(1-x)NaNbO_3$, wherein x is in the range between about 0.28 and about 0.68.

Epitaxial Single Crystal-Single-Crystal Perovskite Solid Solution Composites

As described further herein, prior to the work described in the present disclosure, there was a dearth of appropriate substrates for epitaxial growth of crystals having primitive lattice parameters between about 0.387 nm and about 0.412 nm. In an embodiment, the present disclosure provides single-crystal perovskites having primitive lattice parameters within this range useful, for example, for epitaxial growth of single crystals.

Accordingly, in an aspect, the present disclosure provides a structure comprising a single-crystal perovskite as described further herein; and an epitaxial single crystal epitaxially disposed on the single perovskite crystal.

In an embodiment, the epitaxial single crystal is not congruently melting.

In an embodiment, the epitaxial single crystal has a perovskite crystal structure. In an embodiment, the epitaxial single crystal having a perovskite crystal structure comprises a perovskite material selected from the group consisting of $PbTiO_3$, $PbZrO_3$, $PbZr_xTi_{1-x}O_3$, $Pb(Mg_{1/3}Nb_{2/3})O_3$ $SrRuO_3$, $Bi_{0.5}Na_{0.5}TiO_3$, $BiFeO_3$, $BiMnO_3$, $BiCrO_3$, $KNbO_3$, $K_xNa_{(1-x)}NbO_3$, $KTa_xNb_{(1-x)}O_3$, yttrium barium cuprate, a solid solution between $(1-x)Pb(Mg_{1/3}Nb_{2/3})O_3$-$xPbTi_xO_3$, and a solid solution between $xBiScO_3$-$(1-x)PbTiO_3$.

In an embodiment, the epitaxial single crystal includes a perovskite material that is one or more of ferroelectric, electrooptic, ferromagnetic, ferrimagnetic, antiferromagnetic, multiferroic, piezoelectric, pyroelectric, magnetoresistive, colossal magnetoresistive (CMR), magnetooptic, photovoltaic, photoluminescent, insulating, conducting, semiconducting, superconducting, ferroelastic, catalytic and combinations thereof.

In an embodiment, the epitaxial single crystal has an as-grown area between about 10 mm and about 100 mm square or diameter. In an embodiment, the epitaxial single crystal has an as-grown area between about 20 mm and about 50 mm square or diameter. In an embodiment, the epitaxial single crystal has an as-grown area between about 25 mm and about 50 mm square or diameter.

Devices

In another aspect, the present disclosure provides a device comprising an epitaxial single crystal, as described further herein.

In an embodiment, the epitaxial single crystal is free-standing or otherwise separate from the single-crystal perovskite. The epitaxial crystal can be made free-standing according to the methods described herein.

In an embodiment, the device is a device selected from the group consisting of a sensor, an active component, a passive component, a system, and combinations thereof. Because perovskite compounds include ferroelectric, electrooptic, ferromagnetic, ferrimagnetic, antiferromagnetic, multiferroic, piezoelectric, pyroelectric, magnetoresistive, colossal magnetoresistive (CMR), magnetooptic, photovoltaic, photoluminescent, insulating, conducting, semiconducting, superconducting, ferroelastic, catalytic and other materials, many devices, applications and systems that are dependent on the availability of the perovskite material in single crystal form, either as a thin film on a substrate or a free-standing crystal removed from the substrate, are possible because of the single-crystal perovskites described herein.

Such innovative devices, in turn enable higher order systems, applications and services. Many of these applications are currently limited by size, cost and availability of perovskite substrate materials. Accordingly, the single-crystal perovskites described herein provide a substrate for making larger scale perovskite and other single crystals useful in such devices, as described further herein.

In an embodiment, the device is selected from the group consisting of a piezoelectric transducer, a piezoelectric sensor, an electrooptic waveguide device, a magnetooptic waveguide device, an infrared detector, a ferroelectric random-access memory device, a solar cell, a photodetector, a disk read and write head, a biosensor, a microelectromechanical system, a nanoelectromechanical system, a piezoelectric field effect transistor, a piezoelectric field effect photodetector, a magneto-electronic device, a tunnel magnetoresistance sensor, a spin valve, an electrically tunable microwave filter, an electrically tunable microwave oscillator, and an electrically tunable microwave phase shifter.

Methods of Making Single-Crystal Perovskites

In another aspect, the present disclosure provides a method of making a single-crystal perovskite. In an embodiment, the method includes: drying single-crystal perovskite reagents to remove moisture and adsorbed gases from the single-crystal perovskite reagents; combining the single-crystal perovskite reagents to provide a mixture; compacting the mixture; melting the mixture to provide a liquid solution between two perovskite compounds having an indifferent melting point; and generating a temperature gradient within the mixture configured to nucleate and grow the perovskite single crystal.

Figure 14:
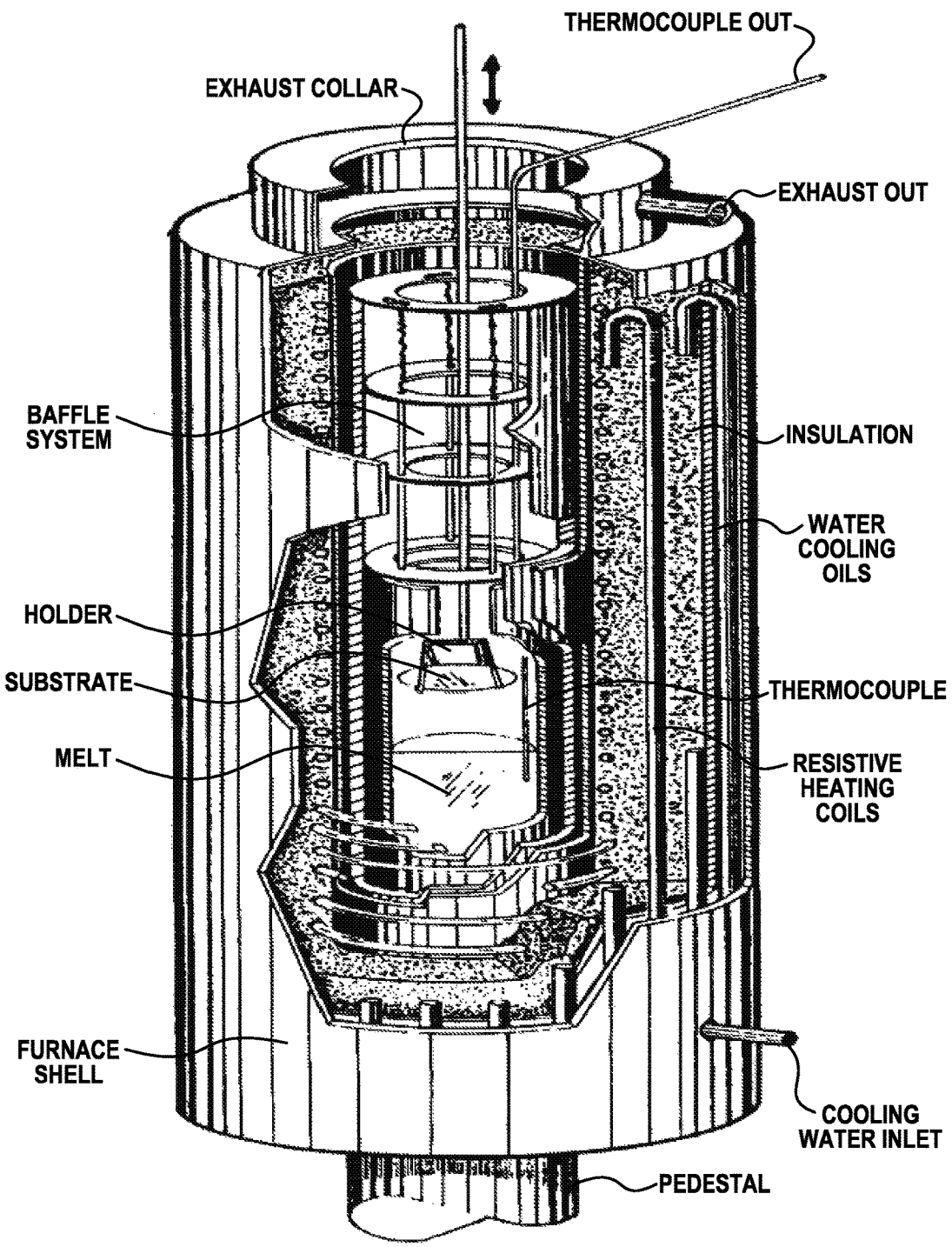
FIG. 14 illustrates a cut-away view of a liquid phase epitaxial crystal growth furnace.

In an embodiment, melting the mixture to provide a liquid solution between two perovskite compounds includes heating the mixture in a reactor. In an embodiment, the reactor is a reactor as discussed further herein with respect to FIG. 14. In an embodiment, the reactor includes a vertical tube furnace. In an embodiment, the single-crystal perovskite is grown in air at atmospheric pressure. In an embodiment, the single-crystal perovskite is grown in an oxidizing atmosphere with an oxygen partial pressure greater than atmospheric oxygen partial pressure.

In an embodiment, melting the mixture to provide a liquid solution between two perovskite compounds includes melting the mixture in a crucible comprising a material selected from the group consisting of platinum, a platinum alloy, a platinum composite or a platinum alloy composite.

In an embodiment, generating a temperature gradient within the mixture includes configuring the radiofrequency (RF) coil or furnace winding, zones, insulation, cooling water coils and pedestal such that the desired temperature gradient occurs within a specific portion of the furnace where the crucible is located, applying after-heater(s) and/or baffle(s) to control the gradient further and observing the fluid flow in the melt as is known to those well versed in the art.

In an embodiment, the single-crystal perovskite comprises a solid solution between two perovskite compounds having an indifferent melting point that occurs at a temperature minimum in a melting curve in a pseudo-binary phase diagram.

In an embodiment, the single-crystal perovskite is grown by a bulk growth method from a congruently melting or near congruently melting liquid solution. In an embodiment, a composition of the liquid solution and the single-crystal perovskite are within 1 atomic percent of all ions in a primitive formula unit for each constituent.

In another embodiment, the liquid solution between the two perovskite compounds has a nearly-congruent composition. In an embodiment, the liquid solution between two perovskite compounds P1 and P2 has an approximate general molar formula $P1_xP2_{1-x}$, wherein x is within 0.2 mole of a molar chemical formula of the single-crystal perovskite. In an embodiment, x is within 0.1 mole of a molar chemical formula of the single-crystal perovskite. In an embodiment, x is within 0.05 mole of a molar chemical formula of the single-crystal perovskite. A wider growth stoichiometric range beyond a mixture having a composition exactly equal to a congruently melting composition is possible because the congruently melting composition is at a temperature minimum in the free energy curve. Therefore, the melt and crystal composition move toward the congruently melting composition as the crystal grows, contrary to the case of conventional solid solutions and congruent compositions that are at a temperature maximum in the free energy curve where the composition moves away from congruency as the crystal grows.

Because of the relatively-low growth temperatures, many of the single-crystal perovskites described herein may be grown from, for example, a crucible comprising a material selected from the group comprising platinum, a platinum alloy, a platinum composite and a platinum alloy composite in air at atmospheric pressure or a more oxidizing atmosphere with a higher partial pressure of oxygen by a number of bulk growth methods selected from the group consisting of Bridgman/Stockbarger, Czochralski, Stepanov, Heat Exchanger Method (HEM), Vertical-Horizontal Gradient Freezing (VHGF), Edge-Defined Film-Fed Growth (EFG), Kyropoulos and Bagdasarov growth methods among others. The Czochralski and Stepanov methods have advantages in that the crystal does not contact the crucible, but the Bridgman-Stockbarger method is better for suppressing evaporation of more volatile oxides. All these methods have the primary steps of drying all the constituent chemicals, weighing them in the proper stoichiometric weight ratios to yield the congruently melting or near congruently melting molar composition (or a specifically targeted composition to take into account constituent volatility), mixing and compacting them, melting them to provide a liquid solution, and generating a temperature gradient that allows the crystal to nucleate and grow from, for example, a specifically determined seed or interface.

In an embodiment, combining the single-crystal perovskite reagents to provide a mixture includes combining the single-crystal perovskite reagents in a ratio to provide a congruent molar composition. In an embodiment, combining the single-crystal perovskite reagents to provide a mixture includes adding one or more higher-vapor pressure constituents in excess of what is strictly required for a congruently melting composition.

In an embodiment, the method includes slicing the single-crystal perovskite into one or more wafers. In an embodiment, the method further includes lapping and polishing one or more sides of the one or more wafers. In this regard, the method provides a plurality of substrates, for example, for further epitaxial deposition.

Epitaxial Perovskite Crystal Growth on Perovskite Substrates

As above described above, there is a dearth of commercially-available perovskite substrates having a primitive lattice parameter between about 0.387 nm and about 0.412 nm. In an embodiment, the single-crystal perovskites described herein have primitive lattice parameters within this range. Accordingly, the substrates described herein are capable of serving as substrates for epitaxial growth of commercially-relevant single crystal and, in an embodiment, the methods described herein further include epitaxially growing an epitaxial single crystal on one or more surfaces of the single-crystal perovskites described herein.

In an embodiment, epitaxially growing the epitaxial single crystal includes vapor phase methods of epitaxial growth. In an embodiment, vapor phase methods of epitaxial growth include sputtering, thermal evaporation, physical vapor deposition (PVD), chemical vapor deposition (CVD), metal-organic chemical vapor deposition (MOCVD), vapor phase epitaxy (VPE), organo-metallic vapor phase epitaxy (OMVPE), molecular beam epitaxy (MBE), chemical beam epitaxy (CBE), atomic layer epitaxy (ALE), pulsed laser deposition (PLD), and combinations thereof. In an embodiment, such processes are conducted in a vacuum chamber. As a group, they typically allow the substrate to be at a significantly-reduced temperature during epitaxial crystal growth compared to growth techniques from the liquid, especially bulk growth.

Figure 12:
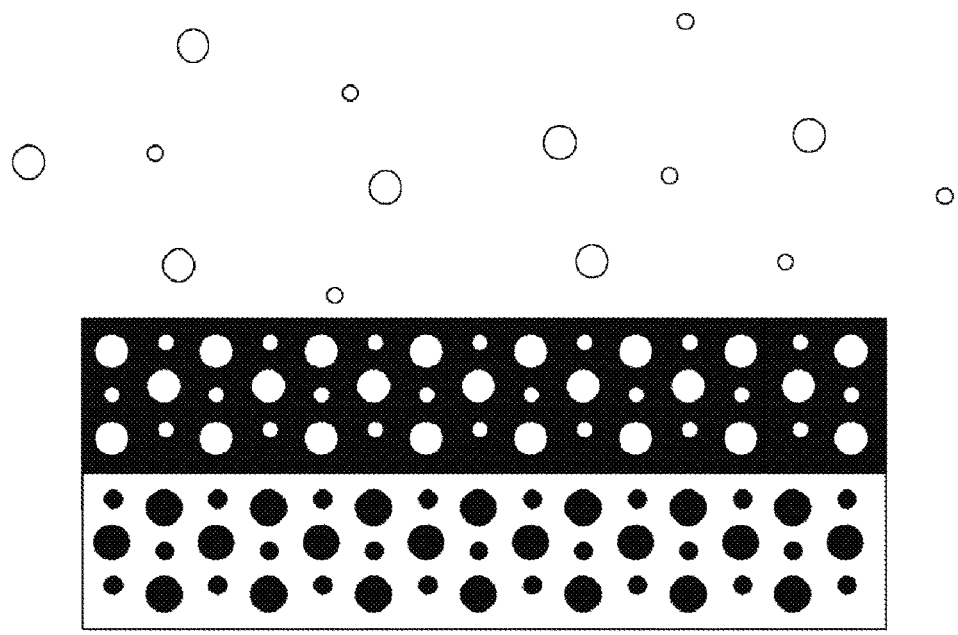
FIG. 12 schematically illustrates an atomistic view of vapor phase epitaxy.

FIG. 12 depicts an atomistic view of epitaxial growth from a vapor phase. The dark atoms in a light background represent the substrate, which is on the bottom. The light atoms in a dark background are the growing film, which is on top exposed to the vapor. Light atoms above the film are in the vapor.

In an embodiment, epitaxially growing the epitaxial single crystal includes an epitaxial growth method including liquid phase methods of epitaxial growth. In an embodiment, liquid phase methods of epitaxial growth include liquid phase epitaxy (LPE) from a high temperature solution (HTS). In an embodiment, liquid phase methods of epitaxial growth include methods selected from the group consisting of flux growth, hydrothermal growth, and sol-gel processing from a metal-organic sol.

Figure 13:
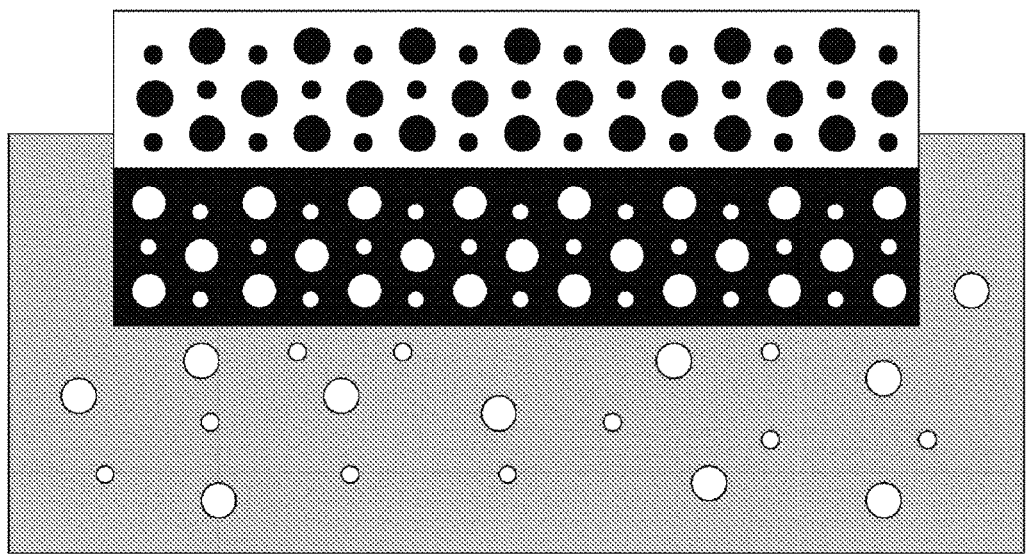
FIG. 13 schematically illustrates an atomistic view of liquid phase epitaxy.

FIG. 13 depicts an atomistic view of LPE. The dark atoms in a light background represent the substrate, which is on top. The light atoms in a dark background are the growing film, which is on the bottom submersed in the fluxed melt. Light atoms (solute) in the gray solvent represent the fluxed melt.

Successful liquid phase epitaxy can include selection of a substrate having one or more of a good structural, chemical, lattice parameter, and thermal expansion match to the desired perovskite composition. Accordingly, in an embodiment, the epitaxial single crystal is a single-crystal perovskite with a primitive perovskite unit cell lattice parameter within 2% or 0.008 nm of the single-crystal perovskite lattice parameter to prevent the formation of misfit dislocations.

Those knowledgeable in the art will understand that the film may have a cubic crystal structure at the growth temperature and a non-destructive phase transition between the growth temperature and room temperature. The phase transition to a lower symmetry structure resulting in non-degeneracy of the crystal directions and non-destructive domain twinning will proceed on cooling according to the cooling program, the anisotropic stress field of a disc or square, and the stress between the film and the substrate. The latter will evolve to minimize the stress energy and give the best possible match. Following growth, poling in an electric field may be used for ferroelectric materials to improve or impose a specific a-b-c orientation match. Choice of the lattice match of the substrate and film may template the film to grow preferentially in the a-b plane depending on the two-dimensional lattice match between the substrate and film.

The facet directions of the perovskites are the (001), (010) and (100) directions of the primitive perovskite unit cell. These are the slowest growing directions and growth typically occurs by atomic/molecular addition at steps, kinks, and dislocations, which can create an as-grown surface with bunched islands, micro- and macro-steps, spirals, growth hillocks and possible impurity segregation at the steps and dislocations. This is undesirable for LPE where a fast-growing direction perpendicular to the substrate and a smooth uniform growth surface is desired. This best occurs for an atomically rough non-facet growth direction where almost all surface sites are growth sites.

Non-facet surfaces can be achieved by growing on substrates cut at an intentional misorientation from a crystallographically oriented facet, typically 0.5-2.0° off the facet direction, for example the (001) direction in perovskite. This can be preferable if the crystallographic properties of the facet direction are desired in the final crystal. Alternatively, growth can be performed on a crystallographic orientation that is not a facet, for example the atomically rough (111) direction as is used in LPE of garnets. This makes characterization of the resultant films by x-ray diffraction more practical than misoriented substrates.

However, some applications require that the exact facet surface be the growth surface to achieve the desired properties of the resulting crystal film. In this case the growth conditions may be optimized to achieve kinetic roughening at the atomic or micro level, but have a relatively smooth film at the macro level.

In certain embodiments, it may be useful to have the epitaxial crystal separated from or physically independent of the single-crystal perovskite from which it is grown. Accordingly, in an embodiment, the methods described herein include removing the epitaxial single crystal from the one or more surface of the single-crystal perovskite to provide a free-standing single crystal.

The epitaxial crystals described herein are grown epitaxially on the single-crystal perovskite described herein. Accordingly, in an embodiment, the epitaxial single crystal has a perovskite crystal structure that can grow disposed upon and in registry with the single-crystal perovskite with lower lattice strain. In an embodiment, the single crystal having a perovskite crystal structure is selected from the group consisting of $PbTiO_3$, $PbZrO_3$, $PbZr_xTi_{1-x}O_3$, $Pb(Mg_{1/3}Nb_{2/3})O_3$, $SrRuO_3$, $Bi_{0.5}Na_{0.5}TiO_3$, $BiFeO_3$, $BiMnO_3$, $BiCrO_3$, $KNbO_3$, $K_xNa_{(1-x)}NbO_3$, $KTa_xNb_{(1-x)}O_3$, yttrium barium cuprate, a solid solution between $(1-x)Pb(Mg_{1/3}Nb_{2/3})O_3$-$xPbTi_xO_3$, and a solid solution between $xBiScO_3$-$(1-x)PbTiO_3$.

In an embodiment, the epitaxial single crystal includes a perovskite material that is one or more of ferroelectric, electrooptic, ferromagnetic, ferrimagnetic, antiferromagnetic, multiferroic, piezoelectric, pyroelectric, magnetoresistive, colossal magnetoresistive (CMR), magnetooptic, photovoltaic, photoluminescent, insulating, conducting, semiconducting, superconducting, ferroelastic, catalytic, and combinations thereof.

Other materials that have perovskite-related structures or even unrelated structures may also have a lattice match to the single-crystal perovskites described herein so that they can be grown epitaxially. Accordingly, in an embodiment, the epitaxial single crystal does not have a perovskite crystal structure.

In an embodiment, the epitaxial single crystal is not congruently melting. While the epitaxial crystal structure can be grown from a congruently melting solution, it can also be grown in other ways, as described herein.

EXAMPLES

All chemicals used in the examples are presumed to have been dried previously in air at standard pressure at appropriate temperature to remove moisture and adsorbed gases without decomposing or otherwise changing the constituent. Such drying temperatures commonly range from 150° C. for sodium carbonate to 1000° C. for tantalum oxide.

Example 1

Barium Titanate-Sodium Niobate Substrate Crystal Perovskite Solid Solution Growth by the Czochralski Method Pre-dry in air suitable quantities of barium carbonate $BaCO_3$ at 850° C., titanium oxide $TiO_2$ at 850° C., sodium carbonate $Na_2CO_3$ at 150° C., and niobium oxide $Nb_2O_5$ at 850° C. Mix a charge consisting of 146.77 grams of barium carbonate $BaCO_3$, 59.41 grams of titanium oxide $TiO_2$, 87.95 grams of sodium carbonate $Na_2CO_3$ and 210.06 grams of niobium oxide $Nb_2O_5$ in a ball mill, press it into a solid body in an isostatic press, place it in a platinum crucible of dimensions 50 mm diameter by 50 mm high and put it into a resistance-heated furnace in a pure oxygen atmosphere. This composition intentionally contains a 5% excess of sodium carbonate $Na_2CO_3$ to allow for volatilization of sodium species during growth. A crystal of approximate molar chemical formula $Ba_{0.32}Na_{0.68}Ti_{0.32}Nb_{0.68}O_3$ can be grown from this melt by the Czochralski method with a pulling rate of 1 mm/hour using a (100) oriented seed of the same material produced in a previous growth run on a platinum wire seed. This crystal has a favorable lattice parameter of approximately 0.3958 nm and remains cubic all the way to room temperature. Orient the resultant boule to the (100) direction using x-ray diffraction methods, grind to a cylinder and cut crosswise into slices that are edge finished and polished to an epitaxial finish.

Example 2

Barium Titanate-Sodium Niobate Single-Crystal Perovskite Solid Solution Growth by the Bridgman Method Pre-dry in air suitable quantities of barium carbonate $BaCO_3$ at 850° C., titanium oxide $TiO_2$ at 850° C., sodium carbonate $Na_2CO_3$ at 150° C., and niobium oxide $Nb_2O_5$ at 850° C. Mix a charge consisting of 146.77 grams of barium carbonate $BaCO_3$, 59.41 grams of titanium oxide $TiO_2$, 83.76 grams of sodium carbonate $Na_2CO_3$ and 210.06 grams of niobium oxide $Nb_2O_5$ in a ball mill, load into a platinum Bridgman crucible and seal under a pure oxygen atmosphere to suppress the evaporation of sodium atoms in various forms. Put the loaded crucible into a resistance-heated furnace. A crystal of approximate molar chemical formula $Ba_{0.32}Na_{0.68}Ti_{0.32}Nb_{0.68}O_3$ can be grown from this melt by the Bridgman method (also known as the Bridgman-Stockbarger method). The form of the Bridgman crucible results in the growth of a single crystal by promoting growth of a single nucleated crystal. This crystal has a favorable lattice parameter of approximately 0.3958 nm and remains cubic all the way to room temperature. Orient the resultant boule to the (100) direction using x-ray diffraction methods, grind to a cylinder and cut crosswise into slices that are edge finished and polished to an epitaxial finish.

Example 3

Figure 7:
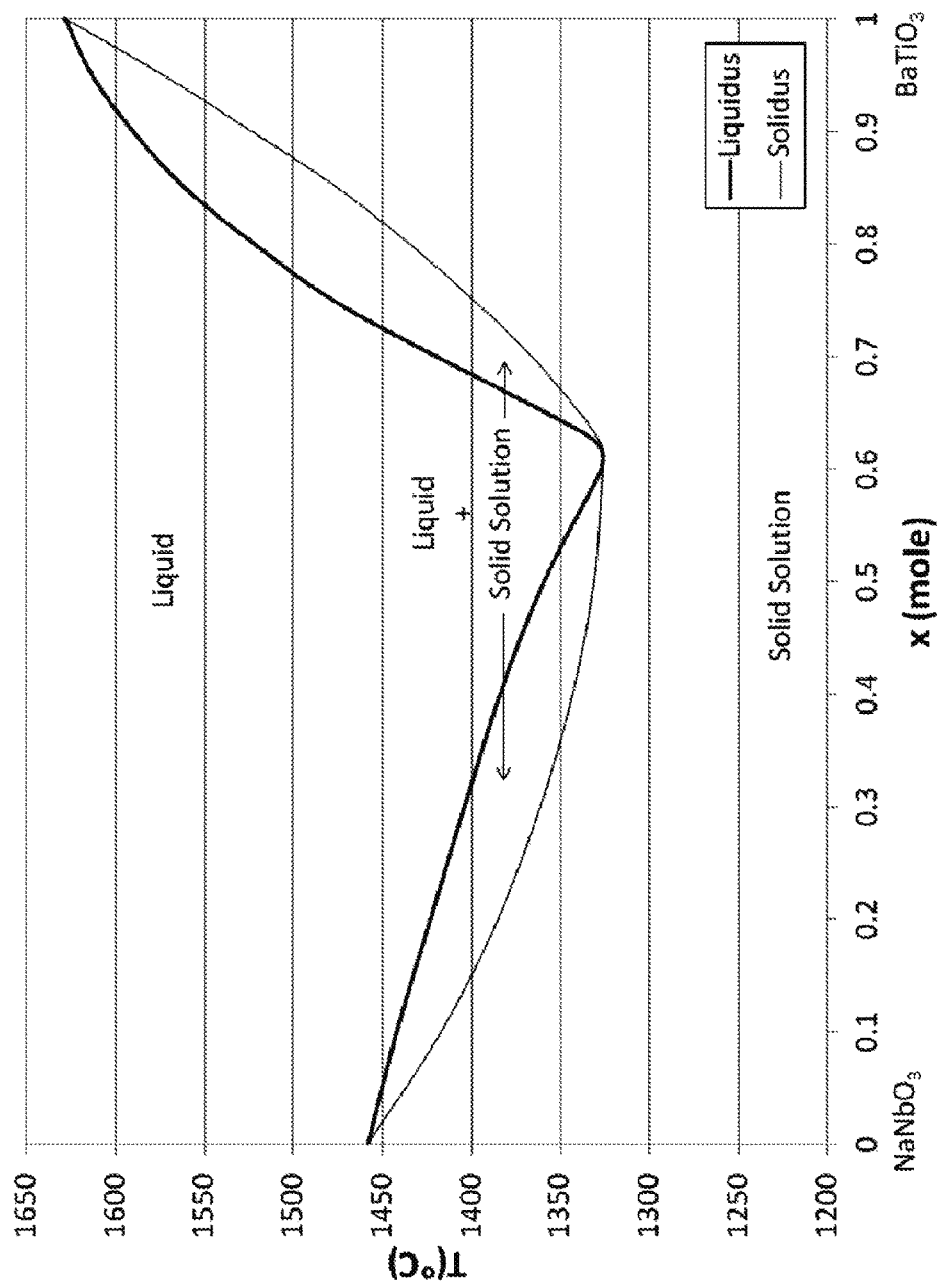
FIG. 7 is a pseudo-binary phase diagram of the continuous solid solution $NaNbO_3$—$BaTiO_3$.
Figure 8:
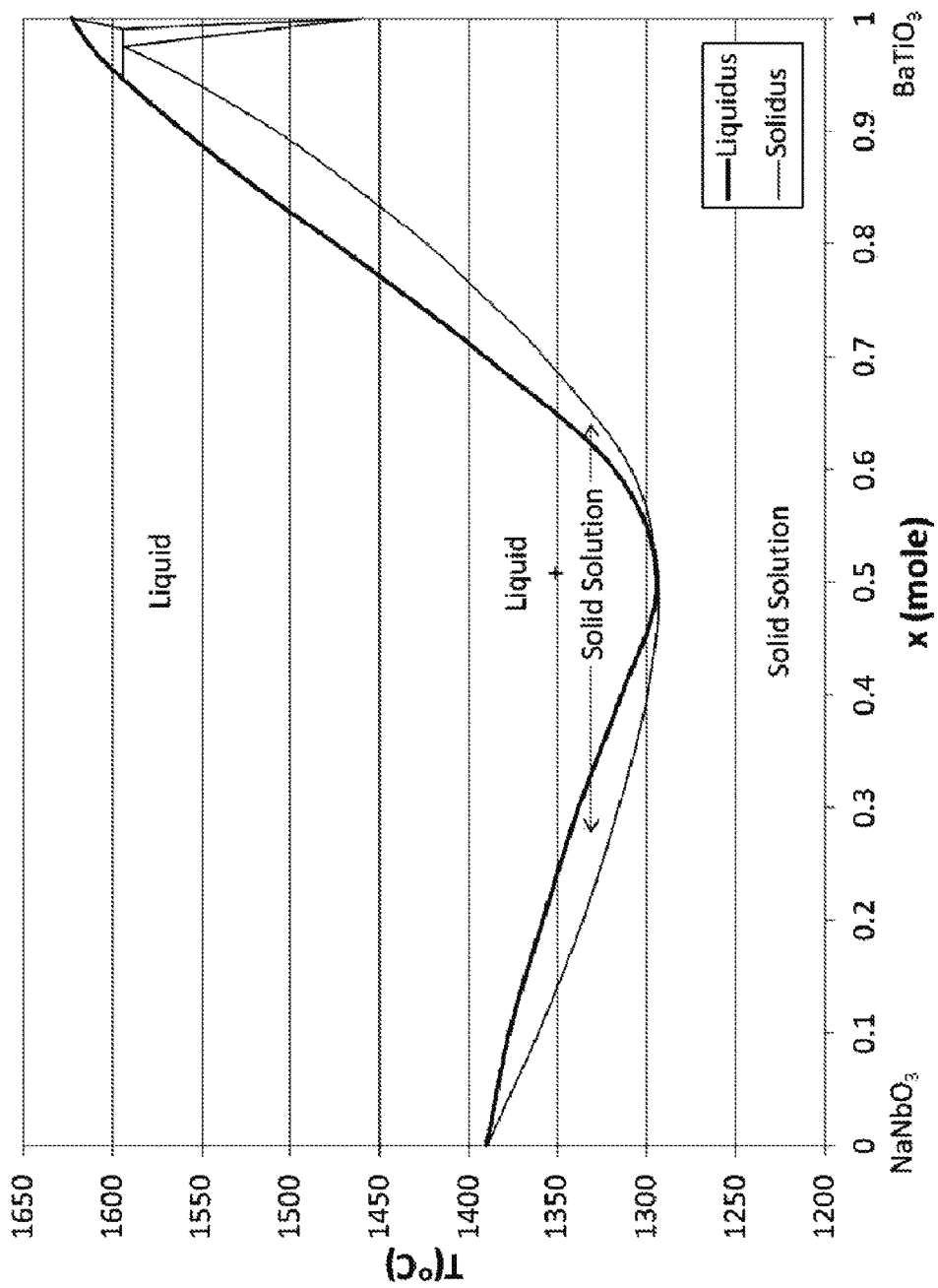
FIG. 8 is a pseudo-binary phase diagram of the continuous solid solution $NaNbO_3$—$BaTiO_3$.
Figure 10:
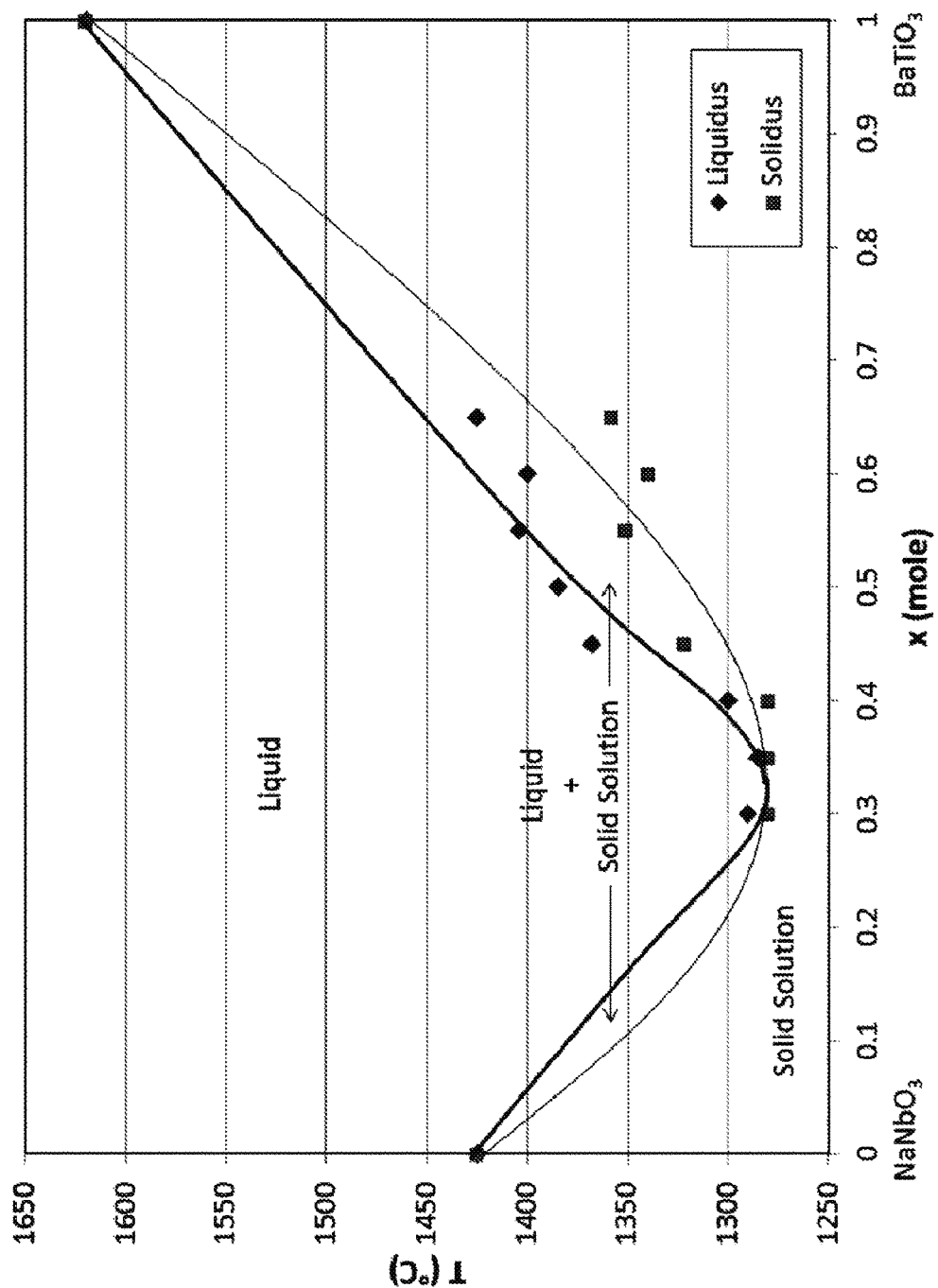
FIG. 10 is a pseudobinary phase diagram of the continuous solid solution $(1-x)NaNbO_3$-$xBaTiO_3$, according to an embodiment of the present disclosure.

Barium Titanate-Sodium Niobate Single-Crystal Perovskite Solid Solution Characterization A number of polycrystalline solid solutions of barium titanate and sodium niobate with an approximate molar chemical formula of $xBaTiO_3$-$(1-x)NaNbO_3$, where $x=0.3$-$0.65$ were prepared by furnace cooling from a melt prepared as described in Examples 1 and 2, having approximate chemical composition $xBaTiO_3$-$(1-x)NaNbO_3$, where $x=0.3$-$0.65$. Additional powder compositions were prepared by solid state reaction of the constituents at 1200° C. In an embodiment, the growth range was between $x=0.22$-$0.42$, where there was the least amount of second phase and the perovskite tolerance factor T is between 0.988 and 1.006. In an embodiment, the growth range, where highest uniformity may be achieved, was immediately adjacent to the determined congruent composition, wherein $x=0.32\pm0.05$. This compositional range is in direct contradiction of earlier publications and the perovskite tolerance factor is $T=0.997$ at the indifferent point, which is closer to the preferred value of unity than the compositions previously published. FIG. 10 displays the congruent melting behavior observed in the current study, in direct conflict with prior art FIGS. 7 and 8.

The structure remained cubic at room temperature for all samples measured from $x=0.3$-$0.65$ and the range may prove broader with additional measurements. Taking these factors into account, a preferred crystal growth range is $x=0.22$ to 0.42 and the most preferred growth range is $x=0.27$-$0.37$. The $x=0.32$ compound $BT_{0.32}$-$NN_{0.68}$ has a simple perovskite lattice parameter of approximately 0.3958 nm and indexes to a simple perovskite body-centered-cubic (BCC) cell (see TABLE III). Cryoscopic examination of a melted charge of $0.32BaTiO_3$-$0.68NaNbO_3$ returned to room temperature did not reveal the lamellar structure typical of eutectic crystallization.

TABLE III

X-ray powder diffraction pattern taken with a Siemens D-8 diffractometer for the $BT_{0.32}$—$NN_{0.68}$ cubic solid solution including inter-planar d-spacings, intensity percentage with respect to the maximum (1, 1, 0) line and planar (h, k, l) indices. The (1, 1, 1) and (3, 1, 1) lines have zero intensity, but are included because they have non-zero intensities for higher values of x. The d spacings have an error bar of 2% and the intensities should not be considered as precise.

| d(nm) | I % | (h, k, l) |
| --- | --- | --- |
| 0.3938 | 21% | (1, 0, 0) |
| 0.2789 | 100% | (1, 1, 0) |
|  | 0% | (1, 1, 1) |
| 0.1975 | 41% | (2, 0, 0) |
| 0.1763 | 9% | (2, 1, 0) |
| 0.1616 | 25% | (2, 1, 1) |
| 0.1400 | 13% | (2, 2, 0) |
| 0.1252 | 10% | (3, 1, 0) |
|  | 0% | (3, 1, 1) |
| 0.1142 | 6% | (2, 2, 2) |

The (1,0,0), (1,1,1) and (3,1,1) lines would not appear if the solid solution was fully disordered with a primitive unit cell. The (1,0,0) line becomes more intense at lower x near the indifferent point, while the (1,1,1) and (3,1,1) lines decrease and disappear. Ordering can appear during cooling, but since these samples were furnace quenched, the fictive (equilibrium) temperature is near 1200° C. This could indicate that an ordering transition, probably second order, is responsible for the difference in the two phases on either side of the minimum, therefore satisfying the phase rule. This could result from partial ordering or clustering resulting from the positive enthalpy of mixing. It could also be a consequence of the differing x-ray cross sections of the substituting ions.

Example 4

Barium Titanate-Sodium Tantalate Single-Crystal Perovskite Solid Solutions

Figure 11:
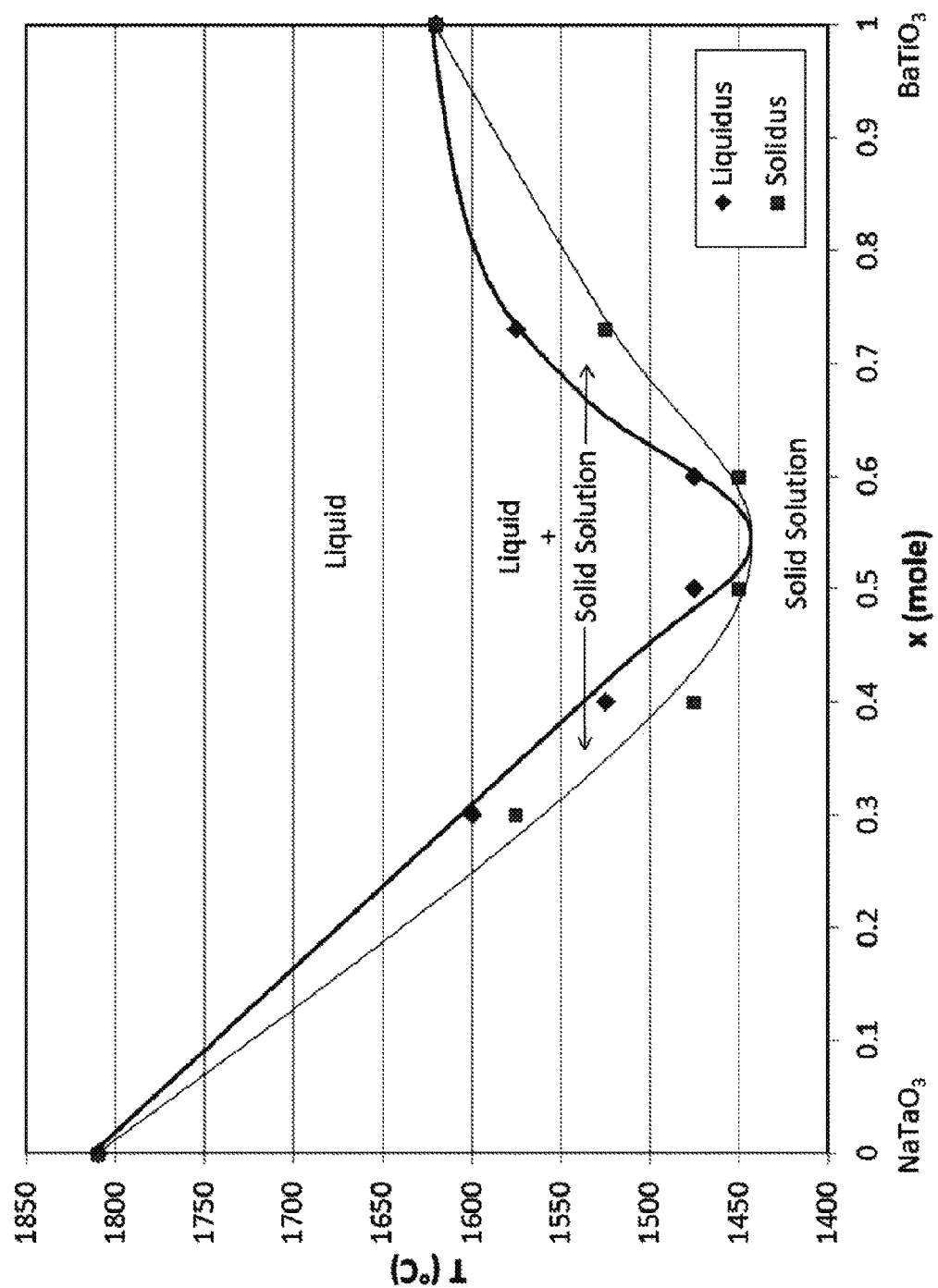
FIG. 11 is a pseudo-binary phase diagram of the continuous solid solution $(1-x)NaTaO_3$-$xBaTiO_3$, according to an embodiment of the present disclosure.

A perovskite single crystal comprising a solid solution of barium titanate and sodium tantalate with approximate molar chemical formula of $xBaTiO_3$-$(1-x)NaTaO_3$, where $x=0.35$-$0.75$, can be grown from a melt of approximate chemical composition $xBaTiO_3$-$(1-x)NaTaO_3$, where $x=0.35$-$0.75$. In an embodiment, the growth range, where highest uniformity was achieved, is immediately adjacent to the congruent composition, wherein $x=0.55\pm0.05$. Ta is chemically similar to Nb and has the same ionic size. The tantalates are somewhat more refractory with 300-400° C. higher melting temperatures for the end members, which would tend to push the indifferent point toward the BT side of the phase diagram. However, the tolerance factor contribution to free energy pushes the minimum back toward the center as seen in FIG. 11. Based on melting temperatures alone, the estimated indifferent point would be x=0.73 where the calculated tolerance factor would be T=1.036, while the measured melting minimum is at x=0.55 where the calculated tolerance factor is T=1.019. This is halfway between the melting temperature estimate of the indifferent point and the solid solution composition where T=1.000, which is x=0.35.

Example 5

Barium Nickel Niobate-Sodium Niobate Substrate Crystal Growth by the Czochralski Method Pre-dry in air suitable quantities of barium carbonate $BaCO_3$ at 850° C., sodium carbonate $Na_2CO_3$ at 150° C., nickel (II) dioxide NiO at 850° C., and niobium oxide $Nb_2O_5$ at 850° C. Mix a charge consisting of 187.78 grams of barium carbonate $BaCO_3$, 57.92 grams of sodium carbonate $Na_2CO_3$, 37.55 grams of nickel (II) dioxide NiO and 221.06 grams of niobium oxide $Nb_2O_5$ in a ball mill, press it into a solid body in an isostatic press, place it in a platinum crucible of dimensions 50 mm diameter by 50 mm high and put it into a resistance-heated furnace in an oxygen atmosphere. This composition intentionally contains a 5% excess of sodium carbonate $Na_2CO_3$ to allow for volatilization of sodium species during melting and growth. A crystal of approximate molar chemical formula $Ba_{0.48}Na_{0.52}Ni_{0.16}Nb_{0.84}O_3$ can be grown from this melt by the Czochralski method with a pulling rate of 1 mm/hour using a (100) oriented seed of the same material produced in a previous growth run on a platinum wire seed. This crystal has a favorable lattice parameter of approximately 0.4014 nm and remains cubic all the way to room temperature. Orient the resultant boule to the (100) direction using x-ray diffraction methods, grind to a cylinder and cut crosswise into slices that are edge finished and polished to an epitaxial finish.

Prior Art Example 1

SLT Substrate Crystal Growth

A charge consisting of 205.43 grams of strontium carbonate $SrCO_3$, 12.85 grams of lithium carbonate $Li_2CO_3$ and 230.61 grams of tantalum oxide $Ta_2O_5$, where all constituents were previously dried, was mixed in a ball mill and pressed into a solid body in an isostatic press. The charge was placed in an iridium crucible of dimensions 50 mm diameter by 50 mm high and put into an RF heated furnace. The melting point of this composition was 1915° C. A crystal of approximate molar chemical formula $SrLi_{0.25}Ta_{0.75}O_3$ (SLT) was grown from this melt by the Czochralski method with a pulling rate of 1 mm/hour using a (100) oriented seed of the same material that had been produced in a previous growth run on an iridium wire seed. The crystal had a favorable measured lattice parameter of 0.4005 nm. The resultant boule was oriented to the (100) direction, ground to a cylinder and cut crosswise into slices that were then polished to an epitaxial finish. It was determined that this material has a destructive phase transition between room temperature and 900° C. that prevented it from being used successfully as a substrate material. Films and substrates cracked up completely on cooling. (V. J. Fratello, G. W. Berkstresser, A. J. Ven Graitis and I. Mnushkina, "A New Perovskite Substrate Material, Strontium Lithium Tantalate", invited talk presented at the 14$^{th}$ International Conference on Crystal Growth, Grenoble, France, Aug. 9-13, 2004).

Prior Art Example 2

Thin Film LPE of $KNbO_3$ on a $SrTiO_3$ Substrate

This epitaxial film was grown by a self-flux method from an excess of $K_2O$. Dried powders of $K_2CO_3$ (99.99% pure) and $Nb_2O_5$ (99.9% pure) were mixed in a molar ratio of 60/40. The mixture was placed in a platinum crucible, then heated to 1100° C., which is above the liquidus, in a three-zone spiral resistor vertical furnace designed for minimization of temperature fluctuations. The melt was cooled to 970° C. A mirror polished (0,0,1) $SrTiO_3$ substrate was mounted vertically on a platinum holder and cleaned in tetrahydrofuran, acetone and ethanol followed by rinsing in deionized water and blowing off with filtered high-pressure air. The platinum holder was attached to a thin alumina tube. This was lowered slowly to just above the melt surface and allowed to come to thermal equilibrium. The alumina tube was rotated slowly and the assembly was dipped in the melt until the entire substrate was submerged. After growth for the desired length of time, the tube and holder were raised to move the substrate and epitaxial film to the upper area of the furnace. It was cooled there to room temperature at a rate of 1.5° C./min. A very thin 100 nm film of $KNbO_3$ grew epitaxially on the substrate with a monoclinic structure that differs from the bulk orthorhombic structure. This structural distortion occurred because of the large 0.0122 nm lattice parameter mismatch between the film lattice parameter and the substrate. Also because of the mismatch, only 100 nm of material could be grown without nucleation of non-epitaxial bulk crystals. At more preferred $KNbO_3$ growth conditions where bulk crystals would not have nucleated, the poor lattice match resulted in epitaxial growth being delayed and some etch pits forming in the $SrTiO_3$ surface. (K. Kakimoto, T. Hibino, I. Masuda and H. Ohsato, "Development of Transparent Single-Crystalline $KNbO_3$ Thin Film by LPE Technique," Science and Technology of Advanced Materials 6 (2005) pp. 61-65)

Example 6

Liquid-Phase Epitaxy of Potassium Tantalum Niobate on Barium Titanate-Sodium Niobate Single-Crystal Perovskite Solid Solution Substrates BT-NN substrates with growth and preparation as defined above in Example 1 or 2 can be used for liquid phase epitaxial growth of epitaxial crystal films of the perovskite crystal structure with lattice parameter match within ±0.008 nm or in the primitive perovskite unit cell range 0.388-0.404 nm, which comprises epitaxial films of the perovskites $BiFeO_3$, KNN, KTN, PZT and many other important materials.

Mix a charge consisting of 74.38 grams potassium fluoride KF, 7.69 grams potassium carbonate $K_2CO_3$, 7.87 grams tantalum oxide $Ta_2O_5$ and 10.06 grams niobium oxide $Nb_2O_5$. Place the charge in a 100 ml volume platinum crucible, in turn placed inside a vertical resistance-heated tube furnace with an air atmosphere per FIG. 14.

This is a vertical tube furnace into which the substrate may be lowered into the melt with the substrate held horizontally (pictured) or vertically. Baffles can be inserted to control convection, temperature gradients and flux evaporation. An exhaust system is used to remove toxic vapors. The furnace may be water cooled or uncooled. The furnace temperature is controlled with a thermocouple(s) on the windings and a thermocouple can be inserted into the melt or the furnace outside the melt to monitor and possibly control the process temperature.

Heat the melt to 980° C. and stir 10-16 hours with a platinum paddle to dissolve the KTN. Cool the melt to 930° C. and dip a horizontally oriented 25 mm diameter substrate of (1,0,0)-oriented BT-NN into the melt. Rotate the substrate at 40-100 rpm, reversing every 1-5 rotations. This is an undercooled melt and so crystals may be grown at a constant temperature at a growth rate of approximately 0.5 micron/minute. After 10 hours growth, remove the substrate and KTN crystal grown on it from the melt and spin above the hot melt at 1000 rpm to remove residual melt. Cool the crystal slowly to room temperature. Any remaining solvent may be dissolved in hot water. Remove the substrate from the crystal by back-lapping and polishing the crystal to the desired thickness.

Prior Art Example 3

Molecular Beam Epitaxy of Lead Titanate on a Lanthanum Aluminate Substrate

A commercial Varian EPI 930 oxide reactive molecular beam epitaxy (MBE) system with all molybdenum parts replaced by stainless steel was used. This system can operate up to eight component sources simultaneously including an effusion cell for lead and a heated titanium source that sublimes this more refractory component. A (1,0,0) oriented $LaAlO_3$ substrate was introduced into the system through an airlock and placed on a substrate block that can be heated radiatively with quartz lamps. The substrate was heated to 600° C. A very low pressure of purified ozone was used to supply oxygen in the growth chamber without impacting the high vacuum required for MBE. In-situ atomic absorption spectroscopy that is part of the MBE system was utilized to monitor the coverage of the surface by each of the metallic components. In this way, atomic layer epitaxy (ALE) was achieved with monolayer control by controlling the opening and closing of the Ti shutter. Using a lead overpressure assures films with proper $PbTiO_3$ 1:1 stoichiometry. This method on $LaAlO_3$ substrates resulted in epitaxial $PbTiO_3$ films up to 1000 Å thick with a mixture of a- and c-axis orientations. (C. D. Theis and D. G. Schlom, "Epitaxial lead titanate grown by MBE," Journal of Crystal Growth 174, (1997) pp. 473-479). Lanthanum aluminate goes through a cubic-rhombohedral phase change as it cools that results in the substrate becoming multi-domain. The problematic mixed orientations of the PT domains most likely result from this.

Example 7

Molecular Beam Epitaxy of Lead Titanate on a Strontium Titanate-Sodium Titanate Single-Crystal Perovskite Solid Solution Substrate Utilize the method of Prior Art Example 3 in all respects except for using a ST-NT substrate of composition as defined in TABLE II. Proper lattice matching with a cubic substrate and no phase change can give a single domain orientation in the film. Films of this type have potential utility in ferroelectric memories.

Prior Art Example 4

Sputtering of Yttrium Barium Cuprate on Magnesium Oxide

A MgO substrate was placed in an ion beam sputtering system equipped with a thermocouple-controlled substrate heater. The substrate heater was set to 750° C. and the substrate was cleaned in situ by treating with an oxygen plasma source discharged at a current of 20 mA and discharge voltage of 1.2 kV so the oxygen partial pressure comes to 4 mTorr. The substrate was cleaned in this way for three hours. After cleaning, the substrate heater was set to 600° C. The oxygen plasma was set to ~1 kV and 9.6 mA at 60 Hz to achieve an oxygen pressure of 2 mTorr. A $YBa_{1.5}Cu_{2.3}O_x$ (YBCO) target was sputtered with 4 keV Ar+ ions so the sputtered particles were deposited on the heated substrate. Sputtering was carried out for a period of six hours. Because of the poor structural match of the film to the substrate, the film was amorphous. (T. Endo, K. I. Itoh, A. Hashizume, H. Kohmoto, E. Takahashi, D. Morimoto, V. V Srinivasu, T. Masui, K. Niwano, H. Nakanishi, "Mechanism of a-c oriented crystal growth of YBCO thin films by ion beam sputtering," Journal of Crystal Growth 229 (2001) pp. 321-324).

Example 8

Sputtering of High Temperature Superconductor on ST-NLT

Utilize the method of Prior Art Example 4 using a ST-NLT substrate of composition described in TABLE II. ST-NLT is a good structural and lattice parameter match to YBCO allowing true crystal growth and epitaxy and elimination of the amorphous phase.

While illustrative embodiments have been illustrated and described, it will be appreciated that various changes can be made therein without departing from the spirit and scope of the invention.

It should be noted that for purposes of this disclosure, terminology such as "upper," "lower," "vertical," "horizontal," "inwardly," "outwardly," "inner," "outer," "front," "rear," etc., should be construed as descriptive and not limiting the scope of the claimed subject matter. Further, the use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. The term "about" means plus or minus 5% of the stated value.

The principles, representative embodiments, and modes of operation of the present disclosure have been described in the foregoing description. However, aspects of the present disclosure that are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A single-crystal perovskite comprising a solid solution between two perovskite compounds having an indifferent melting point that occurs at a temperature minimum in a melting curve in a pseudo-binary phase diagram
   wherein the solid solution between two perovskite compounds is selected from the group consisting of:
      a solid solution of barium titanate-sodium tantalate with an approximate molar chemical formula xBa- $TiO_3$-(1−x)$NaTaO_3$, wherein x is in a range between about 0.35 and about 0.75;

a solid solution of barium titanate-sodium lanthanum titanate with an approximate molar chemical formula $xBaTiO_3$-(1−x)$Na_{0.5}La_{0.5}TiO_3$, wherein x is in a range between about 0.15 and about 0.55;

a solid solution of strontium titanate-sodium tantalate with an approximate molar chemical formula $xSrTiO_3$-(1−x)$NaTaO_3$, wherein x is in a range between about 0.2 and about 0.6;

a solid solution of strontium titanate-sodium lanthanum titanate with an approximate molar chemical formula $xStTiO_3$-(1−x)$Na_{0.5}La_{0.5}TiO_3$, wherein x is in a range between about 0.05 and about 0.45;

a solid solution of sodium niobate-barium lithium niobate with an approximate molar chemical formula $xNaNbO_3$-(1−x)$BaLi_{0.25}Nb_{0.75}O_3$, wherein x is in a range between about 0.21 and about 0.61;

a solid solution between barium titanate and sodium niobate with an approximate molar chemical formula $xBaTiO_3$-(1−x)$NaNbO_3$, wherein x is in a range between about 0.22 and about 0.42; and a solid solution between an alkaline earth (AE) metal nickel niobate perovskite with an approximate molar chemical formula $AENi_{1/3}Nb_{2/3}O_3$ with another perovskite, wherein AE is selected from the group consisting of barium, strontium, and calcium.

2. The single-crystal perovskite of claim 1, wherein the single-crystal perovskite has a cubic crystal structure at about 273° K.

3. The single-crystal perovskite of claim 1, wherein a perovskite tolerance factor, T, of the single-crystal perovskite is between about 0.98 and about 1.02.

4. The single-crystal perovskite of claim 1, wherein
x is in a range between about 0.45 and about 0.65 in the solid solution of barium titanate-sodium tantalate;
x is in a range between about 0.25 and about 0.45 in the solid solution of barium titanate-sodium lanthanum titanate;
x is in a range between about 0.3 and about 0.5 in the solid solution of strontium titanate-sodium tantalate;
x is in a range between about 0.15 and about 0.35 in the solid solution of strontium titanate-sodium lanthanum titanate;
x is in a range between about 0.31 and about 0.51 in the solid solution of sodium niobate-barium lithium niobate; and
wherein x is in a range between about 0.27 and about 0.37, and wherein a perovskite tolerance factor, T, is in a range between about 0.988 and about 1.006 in the solid solution of barium titanate-sodium niobate.

5. The single-crystal perovskite of claim 1 wherein the single-crystal perovskite comprises a solid solution between barium nickel niobate and strontium nickel niobate with an approximate molar chemical formula $xBaNi_{1/3}Nb_{2/3}O_3$-(1−x)$SrNi_{1/3}Nb_{2/3}O_3$, wherein x is in a range between about 0.2 and about 0.9.

6. The single-crystal perovskite of claim 1 wherein the single-crystal perovskite comprises a solid solution between barium nickel niobate and sodium niobate with an approximate molar chemical formula $xBaNi_{1/3}Nb_{2/3}O_3$-(1−x)$NaNbO_3$, wherein x is in a range between about 0.28 and about 0.68.

7. The single-crystal perovskite of claim 1, wherein a composition of end member perovskites is within about 1 atomic percent of nominal integer values of a primitive formula unit.

8. A structure comprising:

a single-crystal perovskite comprising a solid solution between two perovskite compounds having an indifferent melting point that occurs at a temperature minimum in a melting curve in a pseudo-binary phase diagram; and an epitaxial single crystal epitaxially disposed on the single perovskite crystal;

wherein the solid solution between two perovskite compounds is selected from the group consisting of:

a solid solution of barium titanate-sodium tantalate with an approximate molar chemical formula $xBaTiO_3$-(1−x)$NaTaO_3$, wherein x is in a range between about 0.35 and about 0.75;

a solid solution of barium titanate-sodium lanthanum titanate with an approximate molar chemical formula $xBaTiO_3$-(1−x)$Na_{0.5}La_{0.5}TiO_3$, wherein x is in a range between about 0.15 and about 0.55;

a solid solution of strontium titanate-sodium tantalate with an approximate molar chemical formula $xSrTiO_3$-(1−x)$NaTaO_3$, wherein x is in a range between about 0.2 and about 0.6;

a solid solution of strontium titanate-sodium lanthanum titanate with an approximate molar chemical formula $xStTiO_3$-(1−x)$Na_{0.5}La_{0.5}TiO_3$, wherein x is in a range between about 0.05 and about 0.45;

a solid solution of sodium niobate-barium lithium niobate with an approximate molar chemical formula $xNaNbO_3$-(1−x)$BaLi_{0.25}Nb_{0.75}O_3$, wherein x is in a range between about 0.21 and about 0.61;

a solid solution between barium titanate and sodium niobate with an approximate molar chemical formula $xBaTiO_3$-(1−x)$NaNbO_3$, wherein x is in a range between about 0.22 and about 0.42; and a solid solution between an alkaline earth (AE) metal nickel niobate perovskite with an approximate molar chemical formula $AENi_{1/3}Nb_{2/3}O_3$ with another perovskite, wherein AE is selected from the group consisting of barium, strontium, and calcium.

9. The structure of claim 8, wherein the epitaxial single crystal is not congruently melting.

10. The structure of claim 8, wherein the epitaxial single crystal has a perovskite crystal structure.

11. A device comprising an epitaxial single crystal according to claim 8.

12. The device of claim 11, wherein the device is selected from the group consisting of a piezoelectric transducer, a piezoelectric sensor, an electrooptic waveguide device, a magnetooptic waveguide device, an infrared detector, a ferroelectric random-access memory device, a solar cell, a photodetector, a disk read and write head, a biosensor, a microelectromechanical system, a nanoelectromechanical system, a piezoelectric field effect transistor, a piezoelectric field effect photodetector, a magneto-electronic device, a tunnel magnetoresistance sensor, a spin valve, an electrically tunable microwave filter, an electrically tunable microwave oscillator, and an electrically tunable microwave phase shifter.

13. A method of making a single-crystal perovskite comprising:

drying single-crystal perovskite reagents to remove moisture and adsorbed gases from the single-crystal perovskite reagents;

combining the single-crystal perovskite reagents to provide a mixture;

compacting the mixture;

melting the mixture to provide a liquid solution between two perovskite compounds having an indifferent melting point; and generating a temperature gradient within the mixture configured to nucleate and grow the perovskite single crystal, wherein the single-crystal perovskite comprises a solid solution between two perovskite compounds having an indifferent melting point that occurs at a temperature minimum in a melting curve in a pseudo-binary phase diagram, and wherein the solid solution between two perovskite compounds is selected from the group consisting of:

a solid solution of barium titanate-sodium tantalate with an approximate molar chemical formula $xBaTiO_3$-$(1-x)NaTaO_3$, wherein x is in a range between about 0.35 and about 0.75;

a solid solution of barium titanate-sodium lanthanum titanate with an approximate molar chemical formula $xBaTiO_3$-$(1-x)Na_{0.5}La_{0.5}TiO_3$, wherein x is in a range between about 0.15 and about 0.55;

a solid solution of strontium titanate-sodium tantalate with an approximate molar chemical formula $xSrTiO_3$-$(1-x)NaTaO_3$, wherein x is in a range between about 0.2 and about 0.6;

a solid solution of strontium titanate-sodium lanthanum titanate with an approximate molar chemical formula $xStTiO_3$-$(1-x)Na_{0.5}La_{0.5}TiO_3$, wherein x is in a range between about 0.05 and about 0.45;

a solid solution of sodium niobate-barium lithium niobate with an approximate molar chemical formula $xNaNbO_3$-$(1-x)BaLi_{0.25}Nb_{0.75}O_3$, wherein x is in a range between about 0.21 and about 0.61;

a solid solution between barium titanate and sodium niobate with an approximate molar chemical formula $xBaTiO_3$-$(1-x)NaNbO_3$, wherein x is in a range between about 0.22 and about 0.42; and a solid solution between an alkaline earth (AE) metal nickel niobate perovskite with an approximate molar chemical formula $AENi_{1/3}Nb_{2/3}O_3$ with another perovskite, wherein AE is selected from the group consisting of barium, strontium, and calcium.

14. The method of claim 13, wherein the single-crystal perovskite is grown by a bulk growth method from a congruently melting or near congruently melting melt, wherein a composition of the liquid solution and the single-crystal perovskite are within 1 atomic percent of all ions in a primitive formula unit for each constituent.

15. The method of claim 14, wherein the bulk growth method is selected from the group consisting of the Bridgman/Stockbarger, Czochralski, Stepanov, Heat Exchanger Method, Vertical-Horizontal Gradient Freezing, Edge-Defined Film-Fed Growth, Kyropoulos, and Bagdasarov methods.

16. The method of claim 14, wherein the single-crystal perovskite is grown in an oxidizing atmosphere with an oxygen partial pressure greater than atmospheric oxygen partial pressure.

17. The method of claim 14, wherein the mixture includes an excess of a volatile ion configured to compensate for evaporation of one or more of the single-crystal perovskite reagents.

18. The method of claim 14, further comprising slicing the single-crystal perovskite into one or more wafers and lapping and polishing one or more sides of the one or more wafers.

19. The method of claim 14, further comprising epitaxially growing an epitaxial single crystal on one or more surfaces of the single-crystal perovskite.

20. The method of claim 19, wherein epitaxially growing the epitaxial single crystal includes an epitaxial growth method selected from the group consisting of sputtering, thermal evaporation, physical vapor deposition (PVD), chemical vapor deposition (CVD), metal-organic chemical vapor deposition (MOCVD), vapor phase epitaxy (VPE), organo-metallic vapor phase epitaxy (OMVPE), molecular beam epitaxy (MBE), chemical beam epitaxy (CBE), atomic layer epitaxy (ALE), pulsed laser deposition (PLD), and combinations thereof.

* * * * *

UNITED STATES PATENT AND TRADEMARK OFFICE
CERTIFICATE OF CORRECTION

PATENT NO. : 10,378,123 B2
APPLICATION NO. : 16/065688
DATED : August 13, 2019
INVENTOR(S) : V. Fratello It is certified that error appears in the above-identified patent and that said Letters Patent is hereby corrected as shown below:

In the Claims

| Column | Line | |
| --- | --- | --- |
| 35 | 13 | change "xStTiO$_3$-(1–x)Na$_{0.5}$La$_{0.5}$TiO3" to -- xSrTiO$_3$-(1–x)Na$_{0.5}$La$_{0.5}$TiO$_3$ -- |
| 36 | 27 | change "xStTiO$_3$-(1–x)Na$_{0.5}$La$_{0.5}$TiO3" to -- xSrTiO$_3$-(1–x)Na$_{0.5}$La$_{0.5}$TiO$_3$ -- |
| 37 | 31 | change "xStTiO$_3$-(1–x)Na$_{0.5}$La$_{0.5}$TiO3" to -- xSrTiO$_3$-(1–x)Na$_{0.5}$La$_{0.5}$TiO$_3$ -- |

Signed and Sealed this
Second Day of July, 2024

Katherine Kelly Vidal
*Director of the United States Patent and Trademark Office*